United States Patent
Fukunaga

(10) Patent No.: US 8,723,298 B2
(45) Date of Patent: May 13, 2014

(54) LEAD, WIRING MEMBER, PACKAGE COMPONENT, METAL COMPONENT WITH RESIN, RESIN-ENCAPSULATED SEMICONDUCTOR DEVICE, AND METHODS FOR PRODUCING THE SAME

(75) Inventor: Takahiro Fukunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 437 days.

(21) Appl. No.: 13/063,446

(22) PCT Filed: Oct. 28, 2009

(86) PCT No.: PCT/JP2009/005708
§ 371 (c)(1),
(2), (4) Date: Mar. 10, 2011

(87) PCT Pub. No.: WO2010/052856
PCT Pub. Date: May 14, 2010

(65) Prior Publication Data
US 2011/0163345 A1    Jul. 7, 2011

(30) Foreign Application Priority Data

Nov. 6, 2008 (JP) .................................. 2008-285694

(51) Int. Cl.
*H01L 23/495* (2006.01)
(52) U.S. Cl.
USPC .......................................... 257/666; 257/687
(58) Field of Classification Search
USPC .................................. 257/666, 687
See application file for complete search history.

(56) References Cited

U.S. PATENT DOCUMENTS

| | | |
|---|---|---|
| 2002/0048851 A1 | 4/2002 | Ikenaga et al. |
| 2003/0130147 A1 | 7/2003 | Koito et al. |
| 2005/0006794 A1 | 1/2005 | Kashiwagi et al. |
| 2007/0212478 A1* | 9/2007 | Fukunaga et al. ........... 427/96.2 |
| 2008/0261025 A1 | 10/2008 | Abys et al. |
| 2010/0007020 A1* | 1/2010 | Takigawa ..................... 257/741 |

FOREIGN PATENT DOCUMENTS

| | | |
|---|---|---|
| CN | 101038882 | 9/2007 |
| JP | 02-172015 | 7/1990 |
| JP | 06-069366 | 3/1994 |
| JP | 07-183416 | 7/1995 |
| JP | 2731123 | 12/1997 |
| JP | 10-329461 | 12/1998 |

(Continued)

OTHER PUBLICATIONS

PCT/JP2009/005708 International Search Report dated Nov. 24, 2009, 12 pages.

(Continued)

*Primary Examiner* — Phat X Cao

(57) ABSTRACT

The present invention aims to make possible facile removal of resin burrs without the risk of damaging resin body covering a wiring lead in a semiconductor device. In detail, the semiconductor device 10 has a structure in which a semiconductor element is mounted on the wiring lead 10, the wiring lead 10 including a metal plate with metal coating applied to the outer surface thereof. The peripheral region 15 of the wiring lead 11 is covered with an organic coating including purine skeleton compounds. The organic coating is formed through the self-assembling of functional organic compounds each having a structure in which a purine skeleton has at an end thereof a functional group having a metal bonding property.

12 Claims, 20 Drawing Sheets

(56) References Cited

FOREIGN PATENT DOCUMENTS

| | | |
|---|---|---|
| JP | 3076342 | 6/2000 |
| JP | 2002-033345 | 1/2002 |
| JP | 2002-086613 | 3/2002 |
| JP | 2003-114540 | 4/2003 |
| JP | 2005-042099 | 2/2005 |
| JP | 2008-109061 | 5/2008 |
| WO | WO 02/00965 | 1/2002 |

OTHER PUBLICATIONS

Chinese Application No. 200980137057.3 Office Action dated Dec. 31, 2012, 6 pages.

\* cited by examiner

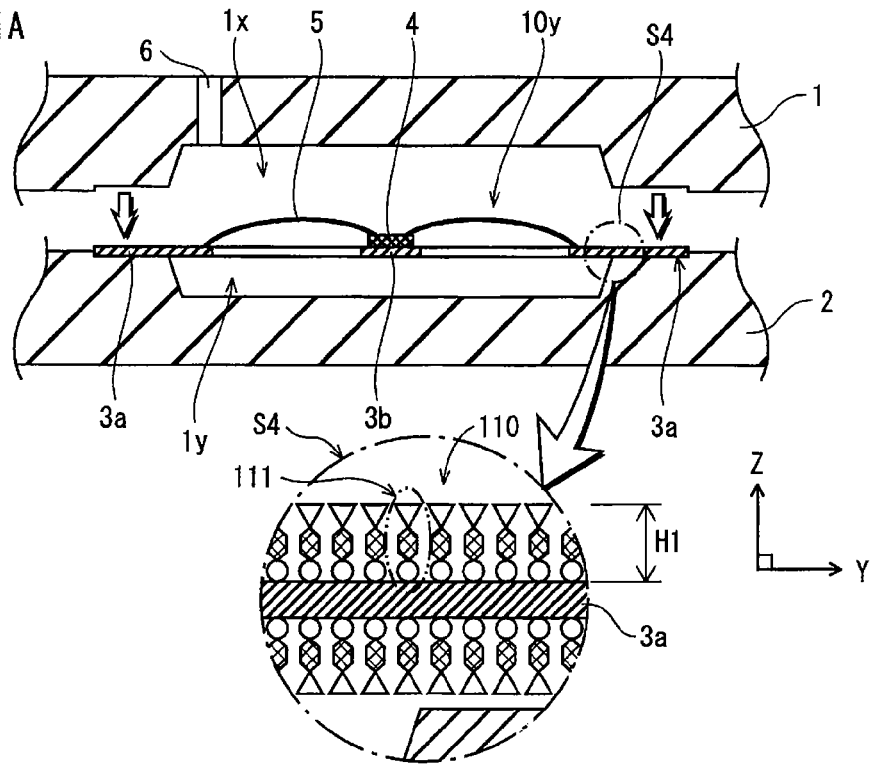
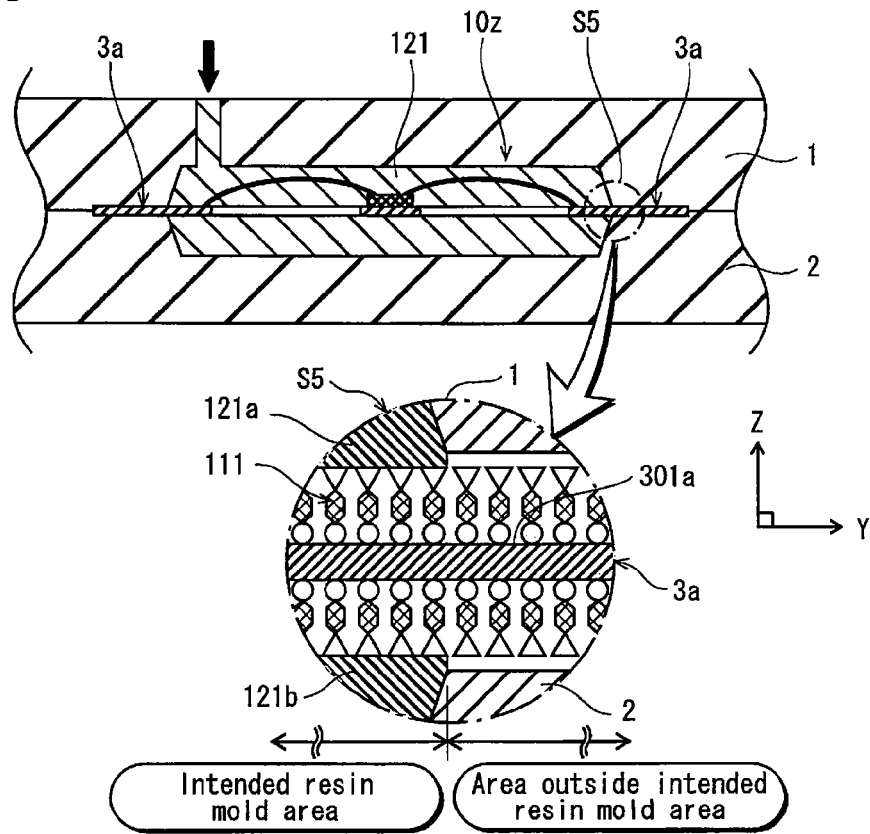

LEAD, WIRING MEMBER, PACKAGE COMPONENT, METAL COMPONENT WITH RESIN, RESIN-ENCAPSULATED SEMICONDUCTOR DEVICE, AND METHODS FOR PRODUCING THE SAME

TECHNICAL FIELD

The present invention relates to a lead, a wiring member, a package component, a resin-coated metal component and a resin-sealed semiconductor device, and manufacturing methods therefor, and in particular to technology for prevention and removal of resin burrs generated during resin molding of a wiring lead.

BACKGROUND ART

In general, fabrication of semiconductor devices such as LEDs or LSIs involve electrically-connecting semiconductor elements with a wiring lead which is composed of a metal plate. The semiconductor element and the wiring lead, with electrical connection established therebetween, are packaged in a resin-covered state.

More specifically, the semiconductor element and the wiring lead are injection-molded using resin. The injection molding is performed by inserting the wiring lead with the semiconductor element adhered thereon between dies, and by injecting thermosetting resin into a cavity formed between the dies (for example, refer to Patent Literature 1).

FIG. 7 shows a resin adhesion step where a wiring lead 102 and a semiconductor element 106 are coated with resin. FIG. 7A shows the wiring lead 102. FIG. 7B shows a state in which the semiconductor element 106 is adhered onto and electrically connected to the wiring lead 102. More specifically, the semiconductor element 106 is adhered onto the wiring lead 102 by die bonding, and electrically connected to the wiring lead 102 by wire bonding using a wire 108.

FIG. 7C shows a state in which a semiconductor intermediate product as depicted in FIG. 7B including the wiring lead 102 is attached to a die for resin coating. The semiconductor intermediate product is resin molded as a resin body 160 by using dies 100 and 110. More specifically, the molding of the resin body 160 is performed such that resin is injected from a resin injection gate 120 and air is released from an air vent 140.

FIG. 7D shows the semiconductor intermediate product yielded by molding the resin body 160.

As it could be seen, the center portion of the wiring lead 102 is covered by the resin body 160. However, resin burrs are formed on peripheral regions 102a of the wiring lead 102 by resin leaking out via gaps formed between the upper and lower dies 100 and 110.

The formation of resin burrs inhibits the electrical connection between the semiconductor element and the wiring lead, and also has negative influences on the solderability and appearance of the wiring lead. Hence, methods for removing resin burrs have been introduced, including such examples as a method of spraying liquids at a high pressure to regions where resin burrs have been formed and a method of roughening a predetermined region of a surface of a die to a specific surface roughness and thereby forming an irregularity on the burr which facilitates removal thereof from the die (for example, refer to Patent Literature 3).

FIGS. 22A through 22D show manufacturing steps for a resin-sealed QFP (Quad Flat Package) semiconductor device.

In the manufacturing steps depicted in FIGS. 22A through 22D, first, a semiconductor chip 94 is mounted onto a die-pad 93b of a wiring lead 93 (including die-pads 93a and 93b), and the semiconductor chip 94 and the die-pads 93a and 93b are connected via a wire 95. Thereafter, the wiring lead 93 is disposed on a fixed die 92 (FIG. 22A).

Next, a movable die 91 is pressed on the fixed die 92 such that the dies 91 and 92 are closed together to form a cavity 97 therebetween. A thermosetting resin is injected into the cavity 97 via a gate 96 provided in the movable die 91, thereby resin-sealing the semiconductor chip 94. (FIG. 22B).

After hardening the thermosetting resin, the dies 91 and 92 are opened, and an ejector pin (undepicted) is used to press out a resin cast 9z. Subsequently, outer leads 931a of the resin cast 9z are bent, thereby yielding a semiconductor device 9 (FIG. 22C).

In implementation of the semiconductor device 9, the outer leads 931a are connected to a substrate 99 via solder 90 (FIG. 22D).

The above are exemplary manufacturing steps for a QFP semiconductor device. There are other types of semiconductor devices, such as a light emitting diode (LED) device. An LED device is manufactured by, for example, forming a substrate in the interior of a mortar-shaped reflector such that a portion of a wiring lead is exposed, and mounting and connecting an light emitting diode element on the wiring lead in the reflector, and thereafter filling the interior of the reflector with a transparent sealing resin.

As for material to be used as sealing resin, silicone resin with a higher light transmittance is currently becoming more widely used in place of epoxy resin, Furthermore, film carrier tape, examples of which are TAB (Tape Automated Bonding) tape, T-BGA (Tape Ball Grid Array) tape, and ASIC (Application Specific Integrated Circuit) tape, and which is used in the implementation of electrical parts of the IC, LSI, etc., has a structure in which an insulating film composed of a polyimide etc., a wiring pattern layer composed of Cu, and a solder resist layer are laminated in the stated order. Here, resin materials are used as the insulating film and the solder resist layer.

CITATION LIST

Patent Literature

Patent document 1: Japanese Patent Application Publication No. H6-69366
Patent document 2: Japanese Patent Application Publication No. 2005-42099
Patent document 3: Japanese Patent Application Publication No. H7-183416
Patent document 4: Japanese Patent No. 2731123
Patent document 5: Japanese Patent Application Publication No. H10-329461
Patent document 6: Japanese Patent Application Publication No. 2002-33345
Patent document 7: Japanese Patent No. 3076342

SUMMARY OF INVENTION

Technical Problem

However, the following problems arise in using resin-molded products as semiconductor devices, LED devices, and film carrier tape.

The first issue is a problem that during the injection-molding of the sealing resin, the resin not only adheres to the intended resin mold area, but also adheres to areas of the wiring lead that are expected to be resin-molded. Similarly, an issue related to this is a problem of insufficient adhesion between the wiring lead and the sealing resin.

As shown in the enlarged portion P of FIG. 22B, in the injection of resin to the cavity in between the dies, there is a possibility that resin burrs 98a are formed on surfaces of the outer leads 931a of the wiring lead 93 when the resin flows into gaps 900 formed between the dies (FIG. 22C). These gaps 900 are formed due to imprecision between the dies 91 and 92, and the resin burrs 98a are formed due to the outflow of the resin material.

The forming of the resin burrs 98a results in problems with the connection strength and electric contact between the outer leads 931a and the substrate 99 in the subsequent step.

Although this problem may be prevented by shaping the dies 91 and 92 with higher precision, not only does high precision designing and production of dies lead to a significant rise in cost, but also it is very difficult to completely prevent the occurrence of gaps in this way due to limitations of machine precision. Hence, in practice, the occurrence of resin burrs cannot be completely prevented by taking such a measure.

Therefore, it becomes necessary to provide a separate step for eliminating the resin burrs 98a before the step for connection with the substrate. This also is problematic, leading to manufacturing efficiency diminishing and manufacturing costs rising.

Additionally, when the measure is taken of spraying high-pressure liquids to portions on which resin burrs have been formed for the purpose of removing the resin burrs, there is a possibility of cracks occurring in the resin body. Also, when the measure is taken of applying surface roughening to the surface of the dies in order to prevent the forming of resin burrs, capillary action causes the irregular parts of the roughened die surface to absorb the sealing resin. This leads to a decrease in releasability of the die, and at the same time makes it necessary for the dies to be cleaned more frequently.

As for other measures for preventing gaps between the dies, there are technologies as proposed for example in Patent documents 4 to 6. In particular, patent documents 4 and 5 propose a technology of increasing the pressure applied by the dies to the wiring lead.

However, implementation of such technology gives rise to the danger of applying excessive deforming stress to the wiring lead, and therefore the fear of damaging the dies and the wiring lead.

Further, Patent document 6 discloses a technology of improving closure of the dies by pre-adhering tape to portions of the dies where the gaps occur. However, even if such tape is used, problems may occur such as detachment of and damage to the tape occurring in the injection step which involves mechanical friction under relatively high temperatures. Moreover, providing the tape gives rise to such problems as reduction in manufacturing efficiency and rise in manufacturing costs.

Furthermore, when the adhesion between the wiring lead and the sealing resin is insufficient, small gaps may be formed between the facing surfaces of the resin and the wiring lead (FIG. 23A), where water infiltrated in the resin gradually accumulates. This is problematic, since during a reflow process in the manufacturing of the semiconductor device, the water accumulated in the gaps may cause pealing and cracks in molded resin 98, and eventually may cause shorting (so-called migration) in the semiconductor chip.

The second issue is a problem arising when silicone resin is used as the sealing resin for resin sealing an LED chip in an LED device.

Although able to maintain a high transparency, silicone resin has a higher linear expansion coefficient than epoxy resin etc. There is therefore a possibility that silicone resin heat-shrinks due to thermal change (so-called thermal history) in the resin material during a step involving injecting molding of silicone resin on the substrate. Accordingly, detachment is caused between the silicone resin and the wiring lead, which may lead to the occurrence of problems such as performance degradation due to poor contact, or insufficient contact strength.

In addition, particularly in wiring leads for LED devices, Ag plating coat which has high reflection coefficient with respect to long wavelength visible light is applied to the surface of the metal plate which composes the wiring lead, and further, an addition silicone resin which is highly transparent is used for the coating thereof. However, there is a problem that platinum chloride compounds which are commonly used as catalysts for addition polymerization of the addition silicone resin may result in the formation of silver chloride as a result of a substitution reaction between the Ag of the Ag plating coat and the platinum chloride compound catalysts. The silver chloride blackens when exposed to light emitted from the LED, and consequently causes the Ag plating coat to discolor.

The third issue is a problem arising when providing Ag plating coat on surfaces of the reflector which surrounds the wiring lead and the LED chip.

Since having a high reflection coefficient with respect to long wavelength visible light, Ag material is used to form Ag coating on surfaces of the reflector as well as on the wiring lead in an LED device, for improving luminous efficiency. However, Ag materials have a comparatively low reflection coefficient with respect to short wavelength light (approximately 500 nm or below). Accordingly, when a blue, violet, ultraviolet, LED etc. is implemented in an LED device, a sufficient reflection coefficient may not be obtained, thus making it difficult for an intended luminous efficiency to be achieved.

In addition, when Ag plating coat is applied to the surface of the reflector, there is a possibility of gas being generated in the manufacturing process adhering to the surface of the Ag coating, and accordingly causing the Ag of the Ag plating coat to alter in an undesirable manner. This causes the reflection coefficient of the Ag material to be degraded, and further leads to the reduction of the luminous efficiency of the LED device.

The fourth issue is a problem occurring when outgas deriving from molding resin material is emitted in the manufacturing process and adheres to the wiring lead. This is problematic, since it may result in wire bonding failures.

Especially, when materials such as thermoplastic resin is used to form the reflector, there are cases where the outgas emitted from the resin material adheres onto the wiring lead. This results in insufficient adhesion between the wire and the wiring lead in the performing of wire bonding, and may cause a so-called state of "wire disconnection" including such problems as improper bonding and wire detachment.

The fifth issue is a problem occurring when Sn plating is applied on the wiring pattern layer in the film carrier tape.

An Sn plating layer is provided on a surface of the wiring pattern layer of the film carrier tape for soldering and thereby connecting implementation parts to the film carrier tape. In the Sn plating step of creating such Sn plating layer, a problem occurs due to the heated atmosphere applied, where ends of the solder resist layer peel, and local electric cells are formed due to the difference in ionization tendency of Sn ions and Cu ions (FIG. 24A). More specifically, local electric cells are formed between a surface area of the wiring pattern layer directly below the peeled solder resist layer and other areas on the surface of the wiring pattern layer. As a result of the formation of the local electric cells, erosion areas are formed by Cu ions eluting into the surface of the wiring pattern layer. This causes reduction in mechanical strength of the film carrier tape after Sn plating, and also leads to the Sn plating not being formed uniformly on the surface of the wiring pattern layer.

The present invention has been achieved in view of the above-mentioned problems, and a first aim thereof is to provide a wiring lead and a manufacturing method thereof, a package component with a wiring lead covered with resin and a manufacturing method thereof, and a semiconductor device which make possible facile removal of resin burrs without the risk of damaging resin coating. Similarly, the present invention provides a manufacturing method for a semiconductor device where the generation of resin burrs is suppressed. In addition to the above, the present invention also aims to provide semiconductor devices with favorable electrical connectivity, bond strength, and sealing reliability by suppressing the occurrence of resin burrs, detachment between the wiring lead and the resin adhered thereto, cracks in the resin or the like.

A second aim of the present invention is to, by improving adhesion between silicone resin and the wiring lead, provide an LED device that can achieve favorable light emitting properties. At the same time, the present invention aims to improve corrosion resistance of Ag coating in a case where the wiring lead is provided with Ag coating.

A third aim of the present invention is to provide an LED device that presents superior luminous efficiency even when emitting relatively short wavelength light by the provision of a sufficient reflection coefficient. Further, a fourth aim of the present invention is to provide an LED device that presents superior luminous efficiency by suppressing the occurrence of such problems as undesirable altering and discoloring of components, the reduction of lighting efficiency, and wiring disconnection.

A fifth aim of the present invention is to provide a film carrier tape that has superior Sn plating layer formation, mechanical strength, and connectivity by avoiding damage to the wiring pattern layer during an Sn plating step, at the same time as maintaining favorable manufacturing efficiency.

Solution to Problem

In order to solve the above-presented problems, the present invention provides a wiring lead, a surface of which is to be partially covered with resin, and which is to be used in the manufacturing of package components, semiconductor devices and the like, comprising: a metal plate; and an organic coating disposed to cover a surface of the metal plate, the organic coating containing a plurality of compounds each having a purine skeleton.

Here, the metal plate is electrically conductive, and has a surface at which a metallic material such as Ni, Pd, Sn, Cu, Ag, and Au is exposed.

Preferably, an area on the surface of the wiring lead excluding a predetermined area on the surface thereof which is to be covered with resin is coated with the organic coating containing purine skeleton compounds.

With regards to the wiring lead pertaining to the present invention, it is also preferable that each of the compounds has one or more polar functional groups in a chemical structure thereof, and the organic coating is disposed such that the one or more polar functional groups of each of the compounds contained in the organic coating bond with the surface of the metal plate.

Here, preferably, each of the one or more polar functional groups is a compound or a derivative of the compound, the compound being selected from a nitrogen-containing heterocyclic compound, a thiol compound, and a sulfide compound.

It is also preferable that each of the purine skeleton compounds is a compound, a fluoride of the compound, or a derivative of the compound, the compound composed of at least one compound expressed by formulas CHEM. 1 and CHEM. 2.

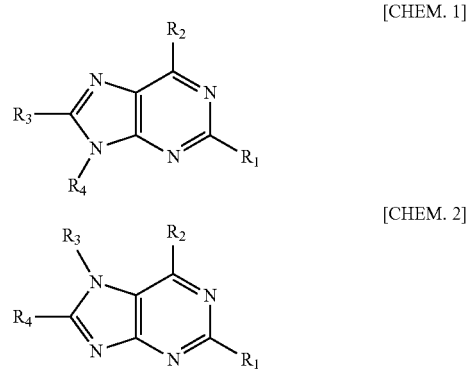

[CHEM. 1]

[CHEM. 2]

(In the above structures, one or more of ends R1, R2, R3, and R4 are provided with a polar functional group, while the other one or more of the ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol.)

A method pertaining to the present invention for manufacturing a resin-coated metal component, comprises: an organic coating formation step of forming an organic coating by (a) depositing a material containing a plurality of functional organic molecules on a wiring lead composed of a metallic material, each of the functional organic molecules having a purine skeleton, a first functional group having a metal bonding property, and a second functional member having a predetermined property, the first functional being provided at one end of the purine skeleton and the second functional group being provided at another end thereof, (b) causing the first functional groups to bond with metal atoms of the wiring lead, and (c) forming an organic coating through self assembly of the functional organic molecules; and a resin adhesion step of disposing resin to cover a predetermined area on the surface of the wiring lead on which the organic coating has been formed, the resin adhesion step being performed subsequent to the organic coating formation step.

Here, the predetermined property of the second functional group includes such properties as a resin-hardening property and a resin-hardening promoting property.

Further, each of the functional organic molecules having a purine skeleton is a compound or a derivative of the compound, the compound composed of at least one compound expressed by formulas CHEM. 1 and CHEM. 2, and examples of the first functional group include a thiol compound, a sulfide compound, and a nitrogen-containing heterocyclic compound.

Preferably, the resin is a thermosetting resin, examples of the thermosetting resin including an epoxy resin, a phenol resin, an acrylic resin, a melamine resin, an urea formaldehyde resin, an unsaturated polyester resin, an alkyd resin, a polyimide resin, a polyamide resin, and a polyether resin. In such a case, the second functional group is selected from a hydroxyl, a carboxylic acid, an acid anhydride, a primary amine, a secondary amine, a tertiary amine, an amide, a thiol, a sulfide, an imide, a hydrazide, an imidazole, a diazabicycloalkene, an organophosphine, and a boron trifluoride amine complex.

Additionally, it is preferable that in the organic coating formation step, the organic coating is formed to cover a greater area than the predetermined area on the surface of the wiring lead where the resin is to be disposed in the resin adhesion step.

In a case where the thermosetting resin is a silicone resin, the second functional group is a compound having a vinyl group or an organohydrogensilane.

Similarly, when the thermosetting resin is a silicone resin containing at least one of an epoxy group and an alkoxysilyl group, the second functional group may be a compound having one selected from a hydroxyl, a primary amine, and a secondary amine, and an acid anhydride.

When the thermosetting resin is a silicone resin, the second functional group may be a metal complex, the metal complex including at least one selected from the group consisting of platinum, palladium, ruthenium, and rhodium.

Additionally, in the resin adhesion step, a conductive paste (die bonding agent) containing silicone resin may be used in adhering silicone resin to the wiring lead.

Further, the second functional group may be at least one selected from the group consisting of a fluorescent compound and a phosphorescent compound.

Further in addition, the organic coating formation step of the manufacturing method of the resin-coated metal component may include: a dispersion fluid preparation substep of preparing an organic molecule dispersion fluid by dispersing the plurality of functional organic molecules in a solvent; and an immersion substep of immersing, in the organic molecule dispersion fluid, a greater area on the surface of the wiring lead than the predetermined area on the surface thereof where the resin is to be disposed.

A method pertaining to the present invention for manufacturing a semiconductor device comprises the above-mentioned steps of the manufacturing method of the resin-coated metal component of the present invention, and a connection step of electrically connecting the wiring lead to a semiconductor element, wherein the connection step is performed between the organic coating formation step and the resin adhesion step, and in the resin adhesion step, the resin is disposed such that the semiconductor element is encapsulated therein while a portion of the wiring lead remains externally exposed.

A wiring member pertaining to the present invention comprises: a wiring lead composed of a metallic material; and an organic coating disposed to cover a surface of the wiring lead, the organic coating being formed through self-assembly of a plurality of functional organic molecules, wherein each of the functional organic molecules has a chemical structure having a purine skeleton, a first functional group, and a second functional group, the first functional group being provided at one end of the purine skeleton and the second functional group being provided at another end thereof, the first functional group being in a form for bonding with the wiring lead by at least one of a hydrogen bond and a coordinate bond, and the second functional group having either one of a resin hardening property and a resin-hardening promoting property, and the first functional groups bond with the wiring lead.

A resin-coated metal component pertaining to the present invention comprises: the wiring member of the present invention having resin disposed to cover a surface thereof, wherein the surface of the wiring lead covered by the organic coating is greater in area than the surface of the wiring member which is covered with resin.

Further, a resin-coated metal component pertaining to the present invention comprises: a wiring member; a reflector for receiving an LED chip to be mounted on the wiring member, the reflector having a mortar-shaped surface and a plating coat formed on the mortar-shaped surface thereof, the plating coat composed of an Ag material; and an organic coating containing a plurality of compounds each having a purine skeleton is disposed to cover a surface of the plating coat.

Here, it is preferable that each of the compounds contained in the organic coating has a first functional group, the first functional group being disposed at one end of the purine skeleton and having a metal bonding property, and the organic coating is disposed to cover the surface of the plating coat such that the first functional groups of the compounds contained in the organic coating bond with the plating coat.

Further, a resin-sealed semiconductor device of the present invention comprises: the above-mentioned wiring member of the present invention; and a semiconductor element mounted on and electrically connected to the wiring lead, wherein resin-sealing of the semiconductor device has been performed such that the semiconductor element is resin-sealed within the surface of the wiring member covered by the organic coating and a portion of the wiring lead remains externally exposed.

A film carrier tape pertaining to the present invention comprises: a wiring patter layer that is composed of a metallic material; an organic coating formed on a surface of the wiring pattern layer; a solder resist layer formed on the organic coating, wherein the organic coating is formed through self-assembly of a plurality of functional organic molecules, each of the functional organic molecules has a purine skeleton, a first functional group, and a second functional group, the first functional group being provided at one end of the purine skeleton and the second functional group being provided at another end thereof, the first functional group having a metal bonding property with respect to the metallic material composing the wiring pattern layer, and the second functional group being in a form for chemically bonding with the solder resist layer, the first functional groups bond with the wiring pattern layer, and the second functional groups bond with the solder resist layer.

A method pertaining to the present invention for manufacturing a film carrier tape comprises an organic coating formation step of forming an organic coating by (a) depositing a material containing a plurality of functional organic molecules on a predetermined area on a surface of a wiring pattern layer, each of the functional organic molecules having a purine skeleton, a first functional group having a metal bonding property, and a second functional member having a predetermined property, the first functional group being provided at one end of the purine skeleton and the second functional group being provided at another end thereof, (b) causing the first functional groups to bond with metal atoms of the wiring pattern layer, and (c) forming an organic coating through self assembly of the functional organic molecules; and a solder resist layer formation step of forming a solder resist layer by applying a solder resist material on the organic coating such that the second functional groups of the functional organic molecules are chemically bonded with the solder resist material.

In the manufacturing method for the film carrier tape, it is preferable that the predetermined property of the second functional group is at least one of a resin-hardening property and a photopolymerization initiating property.

In addition, the second functional group may have a resin hardening property and have at least one selected from the group consisting of an acid anhydride and a primary amine compound.

Furthermore, it is also preferable that the second functional group has a photopolymerization initiating property, being at least one selected from the group consisting of a benzophenone group, an acetophenone group, an alkylphenone group, a benzoin group, an anthraquinone group, a ketal group, a thioxanthone group, a coumarin group, a halogenated triazine group, a halogenated oxadiazole group, an oxime ester group, an acridine group, an acridone group, a fluorenone group, a fluoran group, an acylphosphine oxide group, a metallocene group, a polynuclear aromatic group, a xanthene group, a cyanine group, a squalium group, an acridone group, a titanocene group, and a tetraalkyl thiuram sulfide group, and in the solder resist layer formation step, the applying of the solder resist material to the organic coating is performed while exciting the second functional groups by light irradiation so as to cause the solder resist material to photopolymerize with the second functional groups.

Further, in the manufacturing method for the film carrier tape, the predetermined property of the second functional group may be a photopolymerization initiating property, and in the solder resist layer formation step, the solder resist layer may be formed in a predetermined pattern by, while immersing the wiring pattern layer having the organic coating formed thereon in a dispersion solution in which photopolymerizing molecules have been dispersed, applying a predetermined pattern mask to the wiring pattern layer and irradiating light in the dispersion solution to cause a polymerization reaction with respect to the second functional groups.

Further in addition, the manufacturing method for the film carrier tape may further comprise: an Sn plating layer forming step of forming an Sn plating layer on at least an area on the surface of the wiring pattern layer excluding the predetermined area on the surface thereof on which the solder resist layer has been formed, wherein the wiring pattern layer is composed of a Cu material, and the Sn plating layer forming step is performed after the solder resist layer formation step.

Advantageous Effects of Invention

According to the present invention, the metal plate included in the wiring lead is coated with the organic coating that contains compounds each having a purine skeleton as described above. Therefore, in such cases as in an LED where an Ag thin film is formed on a surface of the wiring lead and the wiring lead is further coated with addition silicone resin, the formation of silver chloride as a result of a substitution reaction taking place between the Ag plating and the platinum chloride compound catalysts is suppressed, and thus discoloring of the Ag coating is prevented.

Further, since the purine skeleton is a nitrogen-containing condensed heterocyclic compound having a planar structure composed of a condensed ring consisting of a pyrimidine ring and an imidazole ring which both have aromaticity, the π electrons of the carbon and the n electrons of the nitrogen included in the structure cause a stacking effect, causing a London dispersion force to occur between the purine skeletons compounds. Therefore, self-assembled organic coating composed of compounds having purine skeletons exhibits high stability.

Therefore, even if there exists a process involving high temperature applied to the organic coating in the implementation process of the semiconductor element (for instance, 300 to 360° C. in gold-tin eutectic soldering), the organic coating is not easily dissolved, and thus sufficiently functions as the coating for surface protection of the wiring lead even in such cases.

Further, chemical compounds to be used for the organic coating of the wiring lead of the present invention is not limited to those with purine skeletons, and other compounds which are condensed aromatic heterocyclic compounds and other compounds having aromatic rings may be used to produce a similar stacking effect resulting from the London dispersion force. However, among such compounds having a condensed aromatic heterocyclic structure, the purine ring compounds are exemplary for use in the present invention, since the purine skeleton itself is very stable, and the heat-resistant coefficient of the organic coating is improved with use thereof.

According to a manufacturing method pertaining to the present invention for a resin-coated metal part, in the organic coat forming step, an organic coating is formed on a wiring lead composed of a metallic material through the self-assembly of the functional organic molecules. Each of the functional organic molecules has a purine skeleton, a first functional group having a metal bonding property provided at one end of the purine skeleton, and a second functional member having a predetermined property provided at another end of the purine skeleton. Owing to this, when the functional organic molecules self-assemble on the surface of the wiring lead, the self-assembly is performed such that the first functional group orients to face the direction of the top surface of the wiring lead, whereas the second functional group is oriented to the opposite direction facing away from the surface of the organic coating. Thus, the second functional group is exposed on the surface of the organic coating.

Hence, when adhering resin material to the surface of the wiring lead in the resin adhesion step, various types of favorable chemical actions are caused between the second functional group exposed on the surface of the organic coating and the resin material, the chemical actions according to the characteristics of the second functional group. Therefore, such problems conventionally found in the field of technology are appropriately addressed.

That is, when providing the second functional group with a chemical bonding property for resin material, the bonding force between the resin material adhered to the organic coating and the organic coating is strengthened.

Also, when the second functional group has the characteristic of hardening the resin material or promoting hardening of the resin material, the hardening of the resin material is performed quickly. Thus, the resin material filled into the cavity quickly hardens on the surface of the organic coating, and even if unnecessary gaps are formed between the dies in the injection molding process, the resin material hardens before flowing into the unnecessary gaps, thus, suppressing the leaking of resin from the gaps.

As such, there is no need for an extra step of eliminating resin burrs after resin molding.

In addition, by forming an organic coating including purine skeleton compounds on the surface of the wiring lead, in the manufacturing process of the semiconductor device, even if outgases are emitted which derive from the molding resin material (especially outgases being emitted when thermoplastic resin is used as a material of the reflector), the organic coating avoids the outgas from directly coming into contact with the wiring lead, and therefore wire bonding failures due to outgases is prevented.

Thus, wire disconnection with respect to the wiring lead caused by outgases is prevented, and wire bonding is performed with a higher degree of certainty.

In addition, when the wiring lead is coated with Ag plating coat, by forming an organic coating including compounds with a purine skeleton on the Ag plating coat, altering of the characteristics of the Ag coating due to the Ag coating reacting with external substances is prevented. Thus, the reflective coefficient of the Ag plate coating is maintained at a high degree.

Note that the effects as described above are obtained without the need of modifying the injection molding device or adding new devices. Hence, according to the above structure of the present invention, a semiconductor device having favorable electric connectivity can be realized at a low cost and with a high manufacturing efficiency.

In addition, since the second functional group has a bonding characteristic with respect to resin material as described in the above, the sealing resin (molding resin) and the wiring lead are strongly adhered via the organic coating, and the forming of gaps between the surfaces thereof is prevented. Therefore, the accumulation of water between the sealing material and the wiring lead is prevented, and cracks and detachment of the resin and the wiring lead occurring in the reflow process of the semiconductor device are prevented, as well as the shorting of the semiconductor chip by water.

More specifically, when the second functional group is a compound including at least one of a vinyl group and an organohydrogensilane, a strong chemical bond is created between the organic coating and the silicone resin.

In addition, when the thermosetting resin is a silicone resin containing at least one of an epoxy group and an alkoxysilyl group, the second functional group may be at least one selected from the group consisted of a hydroxyl, an acid anhydride, a primary amine, and a secondary amine. Hence, a secure chemical bond is obtained between the organic coating and the epoxy group and/or the alkoxysilyl group included in the silicone resin.

Accordingly, forming an organic coating composed of such functional organic molecules on the wiring leads of an LED device enables suppressing the occurrence of problems such as cracks in and peeling of the silicone resin and the wiring lead, degradation in performance due to poor contact under high temperature, and insufficient bond strength, and also realizes stable luminous efficiency in the LED device.

In addition, when providing an organic coating on the surface of the wiring lead, the organic coating composed of functional organic molecules having a platinum complex as the second functional group, the silicone resin filled thereon hardens at an extremely high speed.

Thus, even if unnecessary gaps exist between the reflector and the wiring leads, the present invention effectively prevents the silicone resin from flowing into the gaps.

Note that, when using a conductive paste including silicone resin (a die bonding agent such as an Ag paste) in the resin adhesion step for die bonding, secure bonding of the semiconductor chip to the die-pad in an LED device or the like is realized. Further, the stabilization of electrical and thermal conductivity is realized at the same time due to a lower degree of degradation compared to a conventional epoxy resin-containing conductive paste.

Furthermore, when using a silicone resin-containing conductive paste containing Ag particles, the Ag particles may be coated with the organic coating of the present invention. This enables the prevention of discoloring of Ag particles included in the conductive paste.

Also, in the LED device, when Ag plating coat is applied to the wiring lead, the reflection coefficient with respect to short wavelength visible light is comparatively low due to the Ag plating coat. However, by providing the wiring leads with an organic coating composed of functional organic molecules that each include a fluorescent or phosphorescent compound as the second functional group, the reflection coefficient with respect to ultraviolet light or short wavelength visible light is improved, which further achieves overall favorable luminous efficiency for the device.

Also, in an LED device, by forming an organic coating composed of purine skeleton compounds onto the surface of the Ag plating coat when forming a Ag plating coat on the inner surface of the reflector which is disposed to surround the LED chip, the direct adhesion of outgases (outgases deriving from the thermoplastic resin material) emitted in the manufacturing process onto the Ag plating coat can be prevented. This leads to the reflective coefficient of the Ag plating coat not being impaired, and the manufacturing of an LED device with a favorable lighting efficiency is realized.

Especially, when using a chemical structure where the first functional group being in a form for bonding by at least one of a metal bond, a hydrogen bond, and a coordinate bond by a metal complex is provided at one end of the purine skeleton compound to form the organic coating, an organic coating in which such chemical structure is minutely arranged is formed as a result of self-assembling. Thus, the reflective coefficient of the Ag plating coating can be maintained at a high degree.

Also, when a film carrier tape comprises: a wiring pattern layer that is composed of a metallic material; an organic coating formed on a surface of the wiring pattern layer; and a solder resist layer formed on the organic coating, wherein the organic coating is formed through self-assembly of a plurality of functional organic molecules, each of the functional organic molecules has a first functional group and a second functional group, the first functional group having a metal bonding with respect to the metallic material composing the wiring pattern layer, and the second functional group being in a form for chemically bonding with the solder resist layer, a stable layer structure is maintained between the wiring pattern layer and the solder resist layer.

This prevents the edges of the solder resist layer from peeling off of the wiring pattern layer in the Sn plating step during manufacturing, and enables the manufacture of a high quality film carrier tape by suppressing the occurrence of local electric cells.

Note that in the present invention, the organic coating formed through self-assembly of the functional organic molecules has a highly superior bonding property with respect to the wiring leads. While having a single-molecule thickness, the present invention satisfies the demand for enhancing corrosion resistance, rust resistance, and anti-insulating properties of the area of the wiring leads where the organic coating is formed, and furthermore is very space efficient in the device. There is also no need to remove the organic coating after its provision.

With respect to such points regarding functionality and structure, the present invention is entirely different from general surface processing agents, surfactants, dyes, and so on.

BRIEF DESCRIPTION OF DRAWINGS

These and other objects, advantages, and features of the invention will become apparent from the following description thereof taken in conjunction with the accompanying drawings, which illustrate specific embodiments of the present invention.

FIGS. 11A and 11B show a resin adhering processing pertaining to embodiment 2.

DESCRIPTION OF EMBODIMENTS

Embodiments of the present invention are described below with reference to the drawings. It should be noted that the present invention is of course not limited to the following embodiments, and appropriate modifications can be made unless such modifications depart from the technical scope of the present invention.

Embodiments of the present invention are described below with reference to the accompanying drawings.

Embodiment 1

<Structure>

Figure 1:
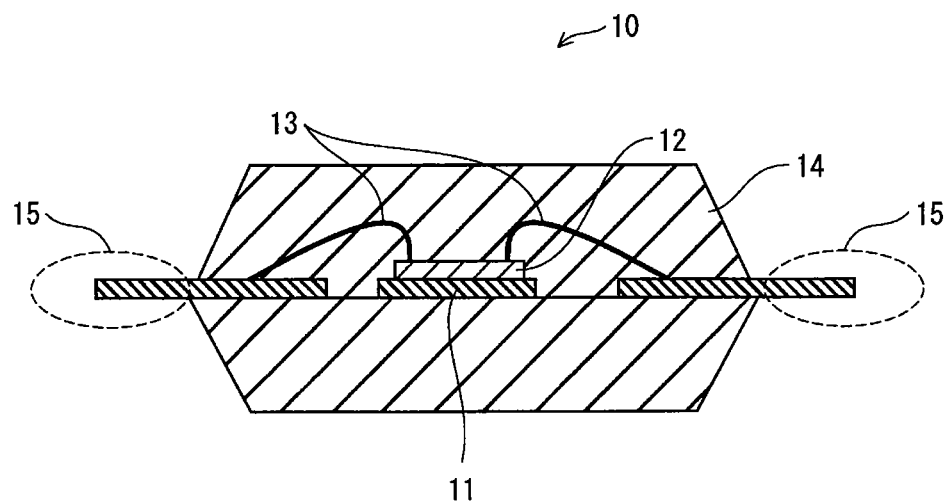
FIG. 1 shows a semiconductor device 10 pertaining to embodiment 1.

FIG. 1 is a sectional view of the structure of a semiconductor device 10 pertaining to the present embodiment. The semiconductor device 10 is a surface-mounted semiconductor device used in an IC, LSI etc., and is composed of a wiring lead 11, a semiconductor element 12, a wire 13 for electrical connection, and a resin body 14 as shown in FIG. 1.

(Wiring Lead 11)

Figure 2:
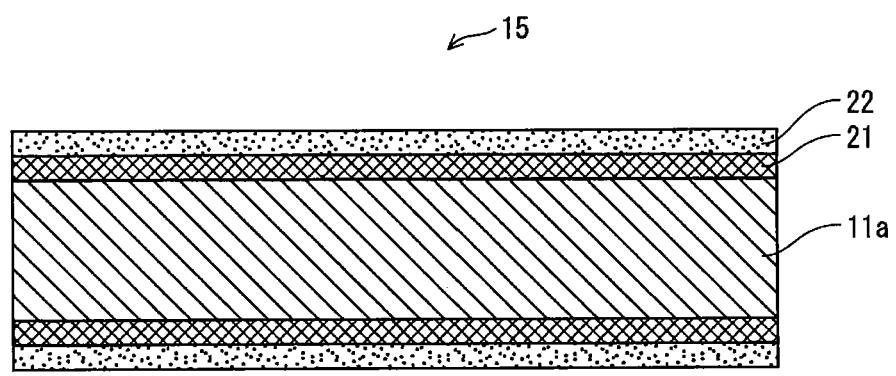
FIG. 2 shows a structure of a portion of a wiring lead 11 which is coated with an organic coating including purine skeleton compounds.

The wiring lead 11 has a structure in which a surface of a metal plate 11a, composed of such metals as copper, copper alloy, steel and steel alloy, is coated with a metal coating 21 (refer to FIG. 2).

The metal coating 21 is composed of at least one layer of such metals as nickel, palladium, tin, copper, silver and gold, and is formed on the surface of the wiring lead by wet or dry plating.

It is exemplary that an outermost layer of the metal coating 21 is either one of silver, gold, and copper.

(Semiconductor Element 12)

The semiconductor element 12 is mounted on the wiring lead 11 by die bonding, and is wire-bonded to electrode pads of the wiring lead 11 using the wire 13 for electrical connection.

(Wire 13)

The wire 13 is used for electrically connecting the semiconductor element 12 with the wiring lead 11.

It is desirable that wires having favorable ohmic characteristics, mechanic connection characteristics, electrical conductive characteristics and heat conductive characteristics be used as the wire 13. For instance, conductive wires composed of such metals as gold, copper, platinum, aluminum and alloys thereof may be used. Such conductive wires can be easily connected to electrode pads with the use of wire-bonding equipment.

(Sealing Resin Body 14)

The resin body 14 is formed such that a portion of the wiring lead 11 as well as the semiconductor element 12 is coated, and thus sealed therewith.

The resin body 14 is composed, for instance, of such materials as epoxy resin, silicone resin, melamine resin, phenol resin, polyphthalamide resin and liquid crystal polymer.

(Peripheral of the Resin Body 14)

In FIG. 1, reference sign 15 indicates a portion (i.e. peripheral region) of the wiring lead which is not coated with the resin body 14. The peripheral region 15 is a portion of the wiring lead in which resin burrs are formed, as description has been made in the "Technical Field" section.

In the peripheral region 15 of the wiring lead 11, the surface of a metal coating 21 is covered by an organic coating 22 composed of compounds each having a purine skeleton.

FIG. 2 is a cross-sectional view showing the structure of the peripheral region 15 of the wiring lead 11. As depicted in FIG. 2, in the peripheral region 15, an outer surface of the metal plate 11a is covered with two layers of coating, one being the metal coating 21 and the other being the organic coating 22 composed of purine skeleton compounds.

(Structure of the Organic Coating 22 Containing Purine Skeleton Compounds)

The organic coating 22 containing purine skeleton compounds is formed of a coating agent composed of either purine skeleton compounds or derivatives thereof.

A purine skeleton compound as referred to herein is a compound having a purine skeleton and a polar functional group having a metal bonding characteristic (for instance, a thiol, a sulfide, a disulfide, a thiol derivative and a nitrogen-containing heterocyclic compound).

For example, the purine skeleton compound may be a compound or a derivative of the compound, the compound being expressed by formulas CHEM. 3 and CHEM. 4 (with the condition that one or more of ends R1, R2, R3, and R4 are provided with a polar functional group, while the other one or more of the ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol).

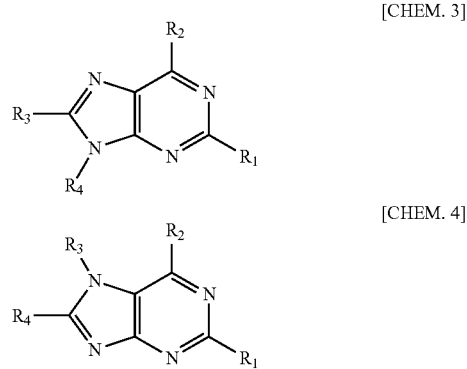

[CHEM. 3]

[CHEM. 4]

A polar functional group is disposed at an end of the purine skeleton compound, and functions as a coupling agent for bonding with the metal coating 21.

The polar functional group may also be a nitrogen-containing heterocyclic compound such as an SH group, and may be formed of such compounds as an imidazole compound, a triazole compound, a tetrazole compound, a diazine compound, a triazine compound, and a tetriazine compound for example. In addition, the polar functional group may also be formed by a compound obtained by chemically modifying a nitrogen-containing heterocyclic compound with a thiol or a thiol salt.

Since a purine skeleton compound is a functional organic molecule having a polar functional group with metal bonding property, purine skeleton compounds, when provided on the surface of the metal coating 21, form a single molecule film with a self-assembled structure on the surface of the metal coating 21.

For example, when the polar functional group is a thiol group (X—SH, where X is a purine skeleton compound or a derivative thereof), the polar functional group adheres to the surface of the metal coating 21 by coordination with a metal atom that can become a single-valent or greater cation, for instance a gold (Au) or silver (Ag) atom), and forming a covalent bond such as Au—S—X or Ag—S—X.

Similarly, if the polar functional group is a disulfide group ($X_1$—S—S—$X_2$), covalent bonds such as Au(—S—$X_1$)(—S—$X_2$) or Ag(—S—$X_1$)(—S—$X_2$) are formed, thereby obtaining a strong bond structure.

If the polar functional group includes a nitrogen-containing heterocyclic compound such as an azole compound or an azine compound, non-covalent electron pairs of nitrogen atoms in the molecules of these compounds can form coordinate bonds with metals that can be double valent or greater cations. This is favorable since, for example, imidazole compounds, benzotriazole compounds, triazine compounds and the like readily form coordinate bonds with metals, mainly with Cu or the like.

Figure 3:
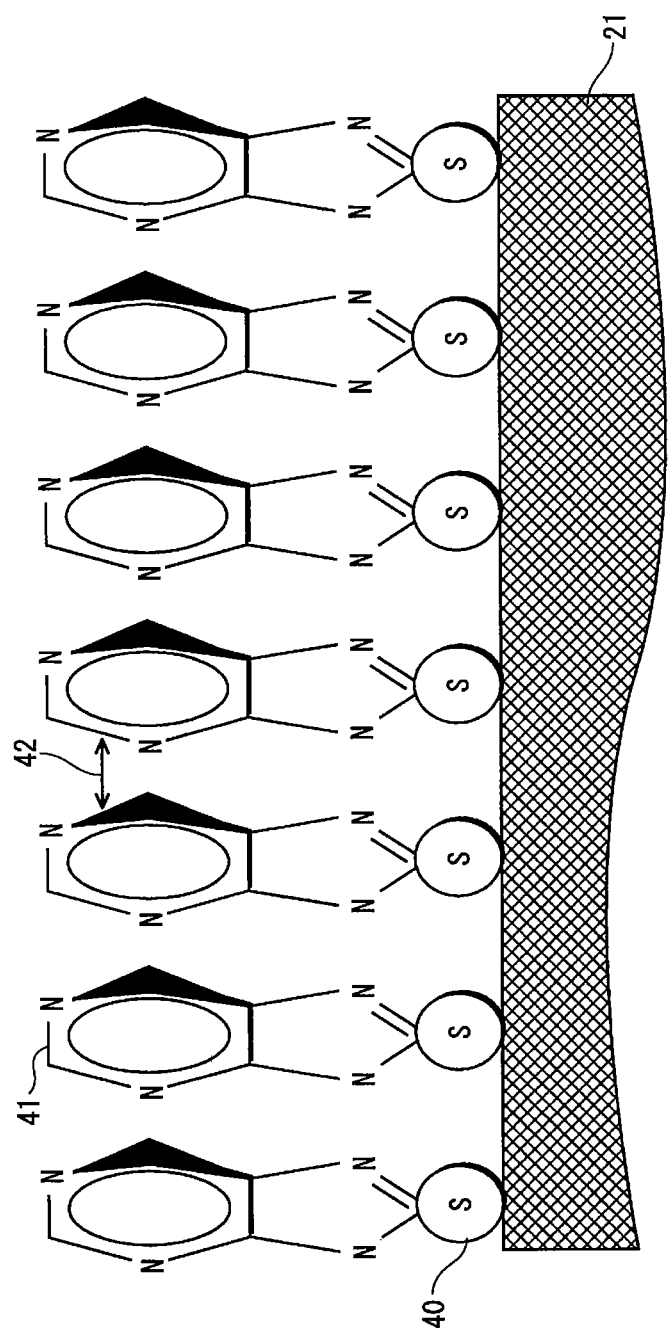
FIG. 3 is a schematic view of an example of a self-assembled single-molecule film formed of the purine skeleton compounds composing the organic coating 22 and formed on a surface of a metal coating 21.

FIG. 3 is a schematic view of an example where a single molecule film is formed on the surface of the metal coating 21, the single molecule film being formed by purine skeleton compounds composing the organic coating 22 self-assembling.

In the example in FIG. 3, a compound containing a thiol or a thiol derivative bonds with the metal on the surface of the metal coating 21 via a thiol (SH) group (indicated as 40 in FIG. 3), and the purine skeletons 41 are arranged on the surface of the metal coating 21 such that the purine skeletons 41 are oriented to face away from the surface of the metal coating 21.

Here, the π electrons of the C and the n electrons of the N contained in the chemical structure of the purine skeleton compound causes a London dispersion force (indicated by the arrow 42) between adjacent purine skeletons 41. As a result, a stacking effect is caused between the adjacent purine skeletons 41, thereby forming a bond therebetween.

As description has been made in the above, in the peripheral region 15 of the wiring lead 11, an organic coating 22 having a self-assembled, single-molecule structure is formed on the surface of the metal coating 21, and further, since purine skeletons 41 are minutely arranged on the surface of the organic coating 22, the infiltration of water and precious metal cations are suppressed and a high corrosion inhibition efficiency and discoloring prevention efficiency is obtained.

Note that, the chemical compounds for composing the organic coating 22 are not limited to purine skeleton compounds. Similar stacking effects caused by London dispersion force may be yielded using such compounds as having condensed aromatic heterocyclic rings or other aromatic rings. However, the use of purine skeleton compounds is exemplary since, among the condensed aromatic heterocyclic rings, a purine ring has an especially stable skeleton, which contributes to the improved thermal resistance of the organic coating.

FIG. 4 is a schematic view showing how discoloring of the silver metal coating 21 caused by platinum group catalysts (for instance, $H_2PtCl_6 \cdot mH_2O$, $K_2PtCl_6$, $KHPtCl_6 \cdot mH_2O$, $K_2PtCl_4$, $K_2PtCl_4 \cdot mH_2O$ (m represents a positive integer)) included in a highly transparent additional silicone resin differs according to the existence or non-existence of the organic coating 22 composed of purine skeleton compounds.

Figure 4A:
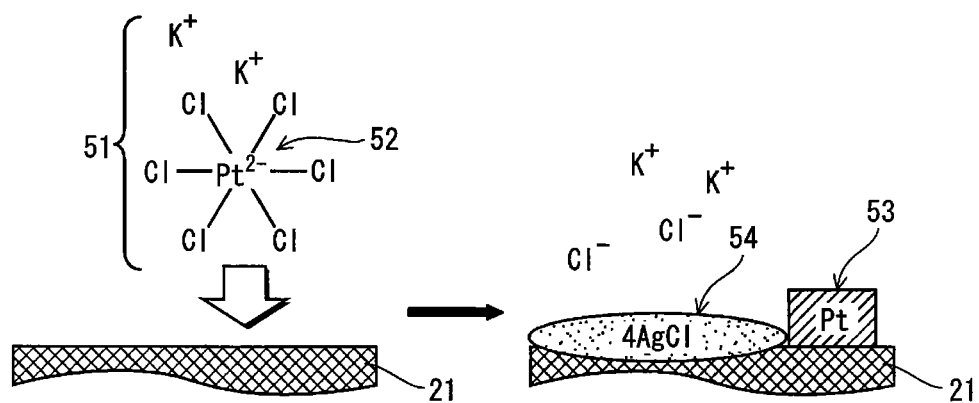
FIGS. 4A and 4B are schematic views showing differences between bonding modes of an epoxy resin molecule and the metal coating 21, with focus on the presence of the organic coating containing the purine skeleton compounds.

FIG. 4A shows a case where the organic coating 22 composed of purine skeleton compounds does not exist. Here, when a platinum group catalyst 51 approaches the surface of the metal coating 21, the platinum 52 contained in the platinum group catalyst 51 causes a substitution reaction with the metal exposed on the surface of the silver metal coating 21.

This results in the generation of silver chloride 54 on the surface of the silver metal as well as the generation of platinum metal 53.

Since the silver chloride 54 readily blackens when exposed to light energy (hv), the silver metal coating 21 is discolored.

Figure 4B:
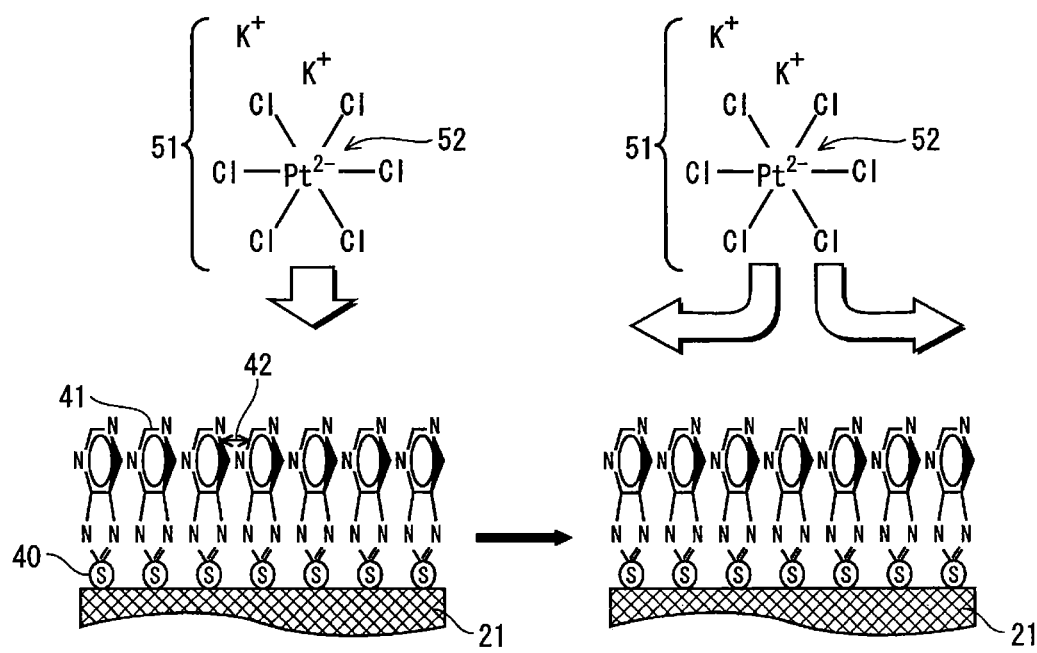

FIG. 4B shows a case where the organic coating 22 composed of the purine skeleton compounds exists. Here, the surface of the metal coating 21 is occupied by thiol groups 40 contained in the organic coating 22, and as a result, the purine skeletons 41 are oriented so as to be exhibited on the surface of the organic coating 22. In such a case, even if the platinum group catalyst 51 approaches the surface of the metal coating in the direction as indicated by the arrow in the figure, the existence of the purine skeletons 41 inhibits the platinum 52 contained in the platinum catalyst 51 from coming into direct contact with the metal coating 21, and therefore the substitution reaction with the silver atoms on the surface of the silver metal coating 21 does not take place. Hence, the generation of silver chloride is suppressed, and further, discoloring of the silver metal coating 21 is restrained.

For the purpose of simplifying the manufacturing process of the wiring lead 11, the organic coating 22 composed of the purine skeleton compounds may be formed so as to cover not only the peripheral region 15 but the entire surface of the wiring lead 11.

<Manufacturing Method>

(Coating Step of the Wiring Lead 11)

The wiring lead 11 is formed by applying stamping or etching to a thin metal plate composed of such metals as copper, copper alloy, steel, and steel alloy. Then, the surface of the wiring lead 11 is plated with such metals as nickel, palladium, silver, and gold to form the metal coating 21.

Subsequently, the organic coating 22 containing the purine skeleton compounds is formed by coating the surface of the metal coating 21 with a coating agent including either one of the purine skeleton compounds as described above under the conditions as described in the following. Thereafter, cleaning processing is performed by using water and/or a solvent such as alcohol to remove excess purine skeleton compounds. This completes the coating processing of the wiring lead 11.

The coating solution used in the coating processing is prepared by dissolving the coating agent in a solvent. Although differing according to the type of coating agent used, it is exemplary that the coating solution is prepared to contain the coating agent at a concentration in a range of approximately 0.1 mg/L~100 g/L. If the concentration is excessively low, the processing will require a large amount of time. On the other hand, even if the concentration is higher than this range, the outcome of the processing will not change above a certain level. This is since, once a single molecule film has been formed on the surface of the wiring lead 11, no more film forming reactions will take place.

The solvent used for dissolving the coating agent therewith may be water, alcohols (for instance, methanol, ethanol, propanol, and butanol), or ketones (for instance, acetone and methyl ethyl ketone).

For the purpose of stabilizing the formation of the organic coating on the metal, an organic acid series, a boric acid series, a phosphoric acid series, or other pH buffering agent may be added as necessary. Furthermore, for the purpose of enhancing the solubility and dispersibility of the coating agent, surfactants consisting of either one of or a combination of an anion series, a cation series, and a nonion series may be used as necessary.

Note that the coating processing may be performed by immersing the wiring lead 11 for a predetermined amount of time in a solution prepared by dissolving a coating agent containing the purine skeleton compounds in a solvent. Alternatively, the solution may be directly applied to the wiring lead 11 or sprayed onto the wiring lead 11 to obtain similar effects.

For instance, by directly applying or spraying the coating agent onto the peripheral region 15 of the wiring lead 11 after the metal plating processing, an organic coating is be formed which contains purine skeleton compounds and which covers only the peripheral region 15 of the wiring lead 11.

(Packaging Step)

Firstly in the packaging step, the semiconductor element 12 is adhered to the wiring lead 11 on which organic coating has been formed, via an electrically conductive paste (e.g. silver paste and gold-tin eutectic solder). Thereafter, the semiconductor element 12 and the electrode pads of the wiring lead 11 are electrically connected by wire-bonding the wire 13 with the electrode pads of the wiring lead 11 using wire-bonding equipment. Then, molding dies are used to mold a resin body 14 such that the semiconductor element 12 and the wiring lead 11 are covered.

When the above resin molding has been completed, such methods as dry or wet abrasive blasting or waterjet blasting is applied for removing resin burrs having been formulated. This completes the manufacturing processing of the semiconductor device 10.

<Supplement>

Figure 5A:
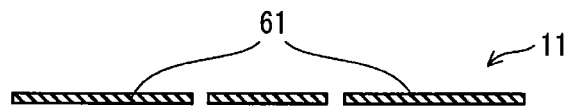
FIGS. 5A through 5E show manufacturing processing of a hollow package resin-sealed semiconductor device.
Figure 5B:
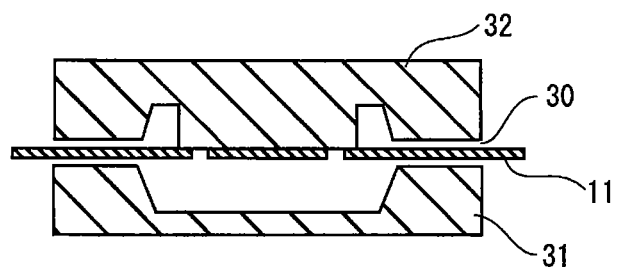
Figure 5C:
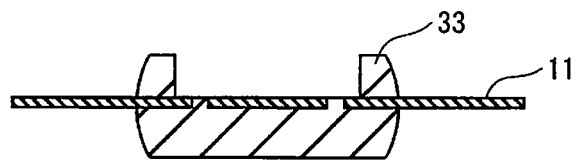
Figure 5D:
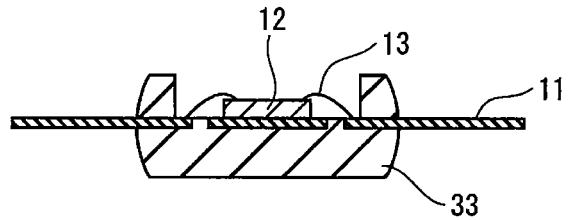
Figure 5E:
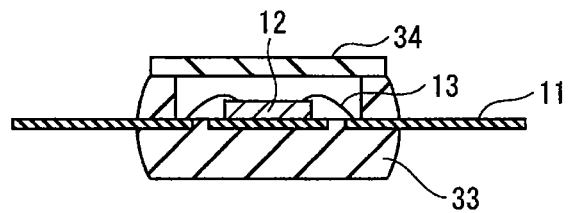

(1) The wiring lead 11 which is coated with the organic coating 22 containing purine skeleton compounds may be applied to resin-sealed hollow package semiconductor devices as depicted in FIG. 5E.

More specifically, a resin-sealed hollow package semiconductor device is manufactured by carrying out each of the procedures (A) through (E) described in the following in the stated order.

(A) In a similar way as in the coating step of the wiring lead 11 of the manufacturing processing of the semiconductor device 10, coating regions (regions indicated as 61) peripheral to the region which is to be resin-sealed, and forming the organic coating 22 composed of purine skeleton compounds thereon.

(B) Disposing the wiring lead 11 having been coated with the organic coating between dies 31 and 32 as depicted in FIG. 5B and closing the dies together to form an inner space therebetween, injecting molding resin therein from a resin injection gate 30 so as to form a molded resin 33 on the wiring lead 11 as depicted in FIG. 5C, thereby yielding a resin body.

(C) Removing resin burrs by applying either dry or wet abrasive blasting or waterjet blasting.

(D) Adhering the semiconductor element 12 to the wiring lead 11 via a conductive paste (e.g. a silver paste, gold-tin eutectic solder or the like) as shown in FIG. 5D, and electrically connecting the semiconductor element 12 with the electrode pads of the wiring lead 11 by wire-bonding the wire 13 with the electrode pads of the wiring lead 11 using wire-bonding equipment.

(E) Finally, covering the aperture above the semiconductor element in the resin body with a resin lid 34, as shown in FIG. 5E.

In addition, light-emitting semiconductor devices such as LEDs may be also produced by covering the wiring lead 11 with resin body.

Light-emitting semiconductor devices may be produced by, after adhering light-emitting elements to the wiring lead 11, resin-coating an aperture above the light-emitting elements using transparent resins such as epoxy resin and silicone resin.

When the present invention is applied to light-emitting semiconductor devices, the effects as described hereinafter are obtained.

It is desirable in the case of light-emitting semiconductors that a silver coating is applied to the surface of the wiring lead as the metal coating 21 so as to improve reflection rate. However, the forming of silver coating on the surface of the wiring lead in such a manner leads to such negative effects as the sulfidization of silver, and the generation of silver chloride due to the substitution reaction between the silver and the platinum chloride compound catalysts contained in the silicone resin, which in result leads to the blackening of the silver coating.

In contrast, when the silver coating is protected by the application of the organic coating containing purine skeleton compounds, the sulfidizing of the silver coating and the generation of silver chloride due to substitution reaction between the silver coating and the platinum chloride compounds is suppressed, and hence the discoloring of the silver coating is prevented.

In addition, since a purine skeleton is a nitrogen-containing condensed heterocyclic ring having a planar structure containing a condensed ring consisting of a pyrimidine ring and an imidazole ring, both of which having aromaticity, a London dispersion force is caused between adjacent purine skeletons by the π electrons of the carbon and the n electrons of the nitrogen contained in the structure. This further causes a stacking effect between adjacent purine skeletons, and therefore an organic coating composed of purine skeleton compounds is extremely stable. Therefore, even if high temperature (for instance, 300-300 degrees Celsius in gold-tin eutectic soldering) is applied to the organic coating in the implementation processing of the semiconductor element, the organic coating does not decompose, and sufficiently maintains the functions of protecting the surface of the wiring lead. This results in a secure bond between the light-emitting semiconductor element and the wiring lead, and a light-emitting semiconductor device having a high luminance reliability over a long period is produced.

Note that a plating processing step may be added, in between the resin burr removal step of (C) and the semiconductor element connection step of (D), of plating the region of the wiring lead 11 which has been coated with the organic coating 22 by use of such metals as silver and gold. This contributes in improving the solderability of the region of the wiring lead 11 which has been coated with the organic coating 22, and thus facilitates the adhesion of the wiring lead 11 to a print substrate.

In addition, the coating step with regards to the organic coating containing purine skeleton compounds may be performed after the plating processing step. This contributes to enhancing the corrosion resistance and anti-discoloring properties of the wiring lead 11.

Additionally, although the organic coating 22 containing purine skeleton compounds has been formed on the peripheral region 15 of the wiring lead in the description above, the present invention is not limited to this. The organic coating 22 may be formed to cover the entirety of the surface of the wiring lead 11 so as to simplify the manufacturing process of the wiring lead 11.

(2) The organic coating 22 containing purine skeleton compounds as description has been made in the above may also be applied to semiconductor devices equipped with a heat sink.

FIG. 6 shows manufacturing processing of a resin-sealed hollow package semiconductor device having a heat sink (referred to as hollow package semiconductor device with heat sink hereinafter) which is coated with the organic coating 22 containing purine skeleton compounds. In the following, description will be made with respect to the manufacturing methods of the hollow package semiconductor device with a heat sink with reference to the accompanying FIG. 6.

Figure 6A:
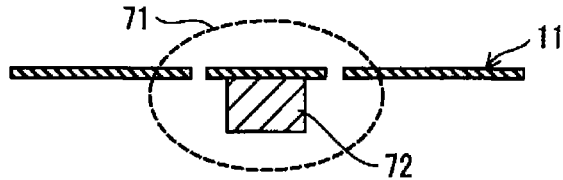
FIGS. 6A through 6E show manufacturing processing of a hollow package semiconductor device equipped with a heat sink.
Figure 6B:
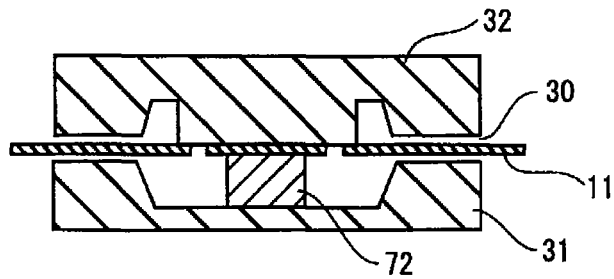
Figure 6C:
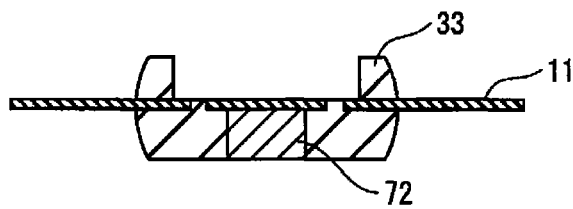
Figure 6D:
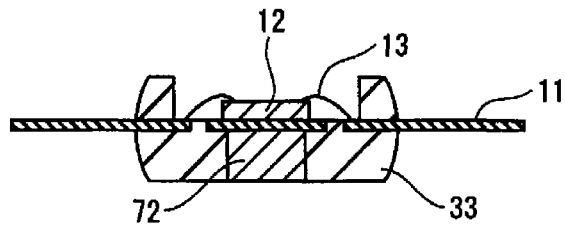
Figure 6E:
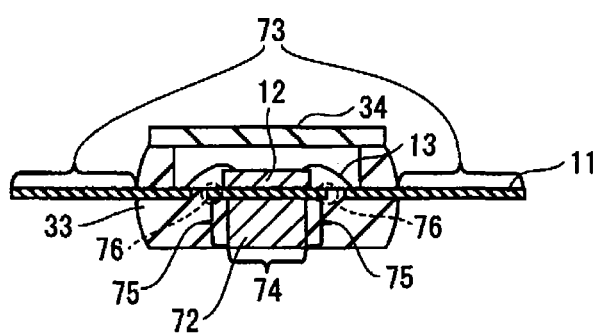
Figure 7A:
FIGS. 7A through 7D show processing involved in resin-sealing the wiring lead.
Figure 7B:
Figure 7C:
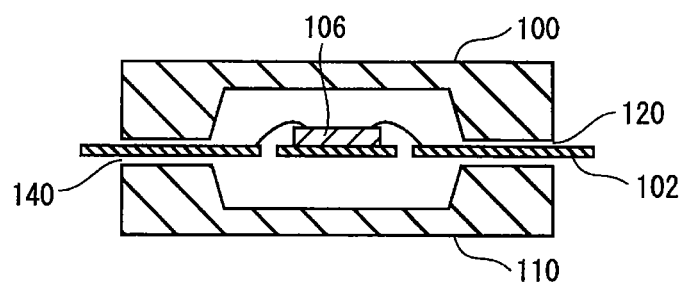
Figure 7D:
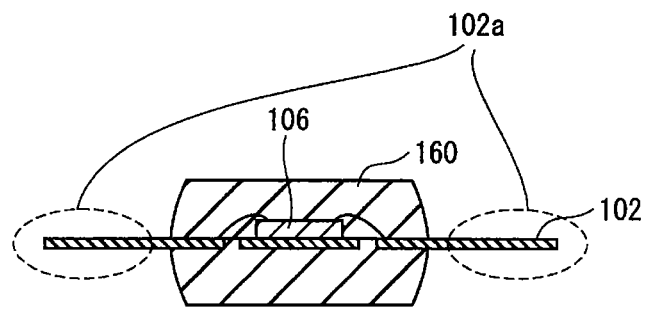

Before the coating processing of the wiring lead 11, a wiring lead-heat sink integrated body (referred to hereinafter as "integrated body") is formed, by adhering a heat sink 72 to the wiring lead 11 as depicted in FIG. 6A using silver paste, silver alloy fillers for silver brazing, caulk or the like. Thereafter, a coating processing is performed, similar to the coating processing of the wiring lead 11 in the semiconductor device 10, to a region (a portion of the wiring lead 11 indicated by 71 and the heat sink 72) to which resin-sealing is to be performed using thermoplastic resin material. Thus, an organic coating 22 containing purine skeleton compounds is formed.

Note that the wiring lead-heat sink integrated body may be formed by applying such methods as rolling, stamping or etching to a material prior to the forming of the wiring lead and to which joggling has been preemptively performed.

Description on the manufacturing procedures following the forming of the organic coating 22 will be omitted, since as depicted in FIGS. 6B to 6E, the procedures are similar to those of steps (B) through (E) on which description has been already made in the Supplement above.

Note that the attachment of a heat sink is not limited to the hollow package resin-sealed semiconductor device as described above. Similar effects can be obtained by attaching a heat sink and applying coating with the organic coating 22 to light-emitting semiconductor devices such as an LED device description on which has been made in Supplement (1) and to the semiconductor device 10 description on which has been made on in embodiment 1.

In addition, when the semiconductor device equipped with a heat sink as description has been made in the above has a silver coating applied to the surface of the wiring lead as a metal coating, the organic coating composed of purine skeleton compounds can be further applied thereto to suppress the generation of silver chloride and prevent discoloring of the silver coating as description has been made in Supplement (1).

In addition, since an organic coating composed of purine skeleton compounds is extremely stable, even if high temperature is applied to the organic coating in the implementation processing of the semiconductor element, the organic coating does not decompose, and sufficiently maintains the functions of protecting the surface of the wiring lead. This results in a secure bond between the light-emitting semiconductor element and the wiring lead, and a light-emitting semiconductor device having a high luminance reliability over a long period can be produced.

Embodiment 2

1. Structure of the Semiconductor Device

Figure 8A:
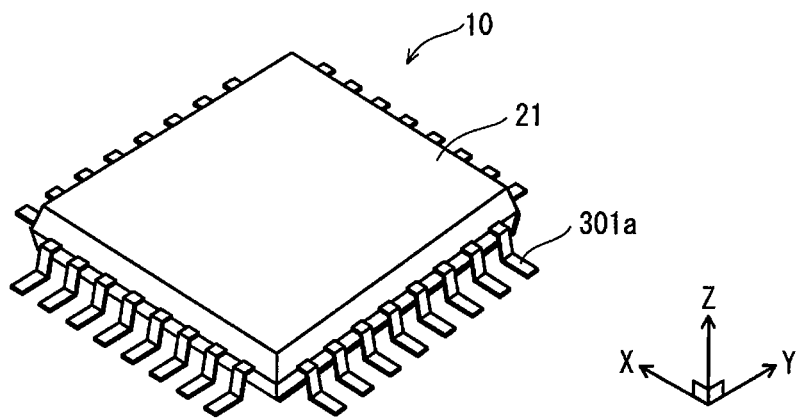
FIGS. 8A through 8C show a structure of a semiconductor device pertaining to embodiment 2.
Figure 8B:
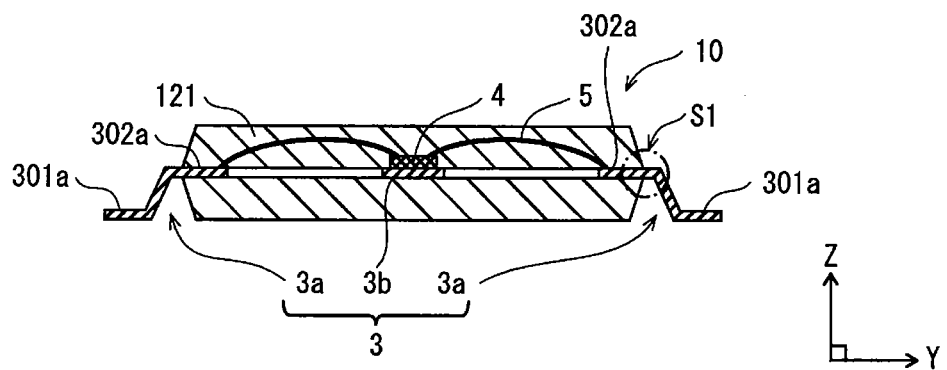
Figure 8C:
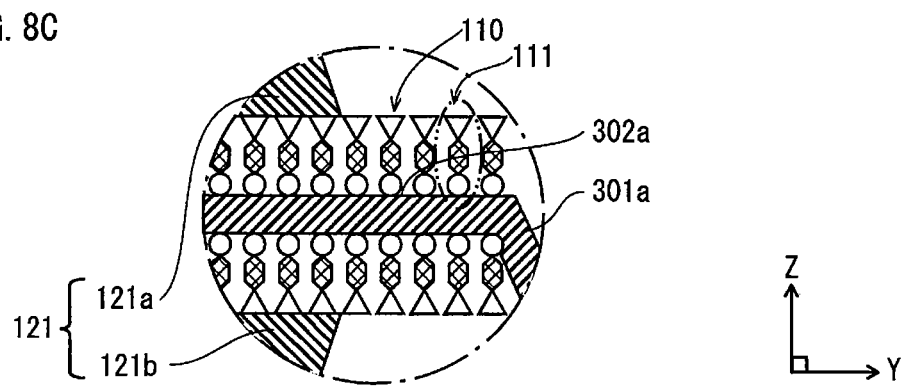

FIG. 8A is an external perspective view showing a structure of a semiconductor device 10 pertaining to embodiment 2. FIG. 8B is a y-z cross-sectional view of the semiconductor device 10. FIG. 8C is an enlarged view of portion S1 in FIG. 8B.

The semiconductor device 10 is similar to the semiconductor device of embodiment 1, and is a surface-mounted semiconductor device QFP (Quad Flat Package) used in an IC, LSI etc., and is composed of a semiconductor chip 4, a wiring lead 3, wire 5, a resin body 121 molded to have a square form, and etc.

The wiring lead 3 is punched out of a metal plate constituted from a metal that has superior electrical conductivity (e.g., copper alloy), and includes die-pads 3*a* and 3*b*. Further, outer leads 301*a* which are a part of the die-pads 3*a* extend out from a circumference of the resin body 121.

As shown in FIG. 8B, the resin body 121 has an internal structure in which the semiconductor chip 4 has been mounted on the die-pad 3*a* and electrically connected to the die-pads 3*a* and 3*b* via the wire 5 and electrode pads which are not depicted. The die-pad 3b and the semiconductor chip 4 are adhered by an electrically conductive paste such as silver paste.

An inner lead 302a is an area of each of the die-pads 3a that is sealed within the resin body 121 (121a and 121b), and an outer lead 301a is an area of each of the die-pads 3a that is exposed to the exterior. Each of the outer leads 301a has been bent into an S shape with respect to a cross-sectional structure thereof.

Here, a characteristic feature of the semiconductor device 10 is that an organic coating 110 has been formed and provided on surfaces of the die-pads 3a at a border area of the inner leads 302a and the outer leads 301a (portion S1 of FIG. 8B).

The organic coating 110 has been formed through the self-assembling of functional organic molecules. The following is a detailed description of the organic coating 110.

2. Structure of the Organic Coating 110

Figure 9:
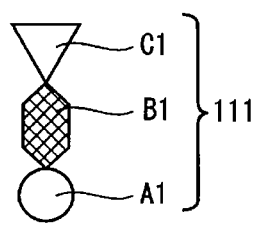
FIG. 9 is a schematic view showing a structure of a functional organic molecule pertaining to embodiment 2.

FIG. 9 shows a schematic structure of a functional organic molecule 111. A purine skeleton has a condensed cyclic structure consisting of a five-membered ring or a six-membered ring. The Illustration in FIG. 9 shows only the six-membered ring, for the mere sake of simplification.

The functional organic molecule 111 has a structure in which one end of the purine skeleton B1 is combined with a first functional group A1, whereas the other end of the purine skeleton B1 is combined with a second functional group C1. The general formula of the functional organic molecules 111 is expressed as A1-B1-C1.

Compounds having the purine skeleton B1 include compounds, fluorides of the compounds, and derivatives of the compounds having side chains, the compounds being expressed by the above formulas CHEM. 3 and CHEM. 4 (with the condition that one of ends R1, R2, R3, and R4 is provided with the first functional group and another one of the ends R1, R2, R3, and R4 is provided with the second functional group, while the other ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol).

The first functional group A1 is a functional part having a metal bonding property and is a compound or a chemical structure containing the compound, the compound being at least one selected from the group consisting of a thiol compound, a sulfide compound and a nitrogen-containing heterocyclic compound.

The second functional group C1 is a functional part having a thermosetting resin hardening property or a thermosetting resin-hardening promoting property and is composed of at least one selected from the group consisting of a hydroxyl, a carboxylic acid, an acid anhydride, a primary amine, a secondary amine, a tertiary amine, an amide, a thiol, a sulfide, an imide, a hydrazide, an imidazole, a diazabicycloalkene, an organophosphine, and a boron trifluoride amine complex. Alternatively, the second functional group may be a compound containing at least one selected from the above group or a chemical structure containing at least one selected from the above group.

As shown in FIG. 8C, the functional organic molecules 111 self-assemble with the first functional groups A1 thereof minutely arranged and bond with the surface of the die-pad 3a composed of a metallic material. Thus, the organic coating 110 is formed as a single molecule film. Accordingly, the second functional group C1 at the other end of the purine skeleton B1 faces away from the outer surface of the organic coating 110, thereby creating a condition where the second functional group C1 is externally exposed on the surface of the organic coating 110. Hence, the surface of the organic coating 110 results in being provided with the characteristics of the second functional group.

The film thickness of the organic coating 110 depends on the size of the functional organic molecules 111, but is adjusted here, for example, to the order of several nm.

Accordingly, the organic coating 110 can minutely protect the surface of the die-pad 3a at a single-molecular level, and as a result, can function to prevent corrosion by the adhesion of water and oxygen gas, and favorably prevent substitution with noble metal salts.

Note that it is necessary to electrically connect the semiconductor chip 4 with the outer leads 301a by wire bonding, die bonding, or the like, and thus there are cases in which a coating such as a metal plating is formed on contact regions of the die-pads and the wiring lead 3 in order to maintain favorable electrical conductivity. Given that a metal plating step is required in such cases, it is preferable to provide the organic coating 110 on portions of the die-pad 3a surface that will not be metal plated, thereby enabling suppression of the problem of the metallic components of the die-pad 3a eluting into the plating fluid due to the ionization tendency of the metallic component.

The following is a detailed description of possible chemical structures of the functional organic molecules 111.

(First Functional Group A1)

As mentioned above, it is required that the first functional group A1 have affinity with metal materials and a metal bonding property (including coordinate bonding). The first functional group A1 may be any chemical structure as long as the above properties are ensured.

For example, hydrogen bonding or coordinate bonding with metal atoms is favorably ensured when the first functional group is one selected from the group consisting of a thiol, a thiol compound containing a thiol, a sulfide compound (e.g., a disulfide compound), and a nitrogen-containing heterocyclic compound (e.g., an azole compound or an azine compound). Alternatively, the same effects are obtained when the first functional group is a compound containing at least one selected from the above group, a chemical structure containing one selected from the above group, or a derivative containing at least one selected from the above group.

If the first functional group A1 includes a thiol group (X—SH, where X is an a purine skeleton or a derivative thereof), the functional organic molecules 111 adhere to the die-pad 3a by coordinating with a metal atom that can become a single-valent or greater cation (e.g., a gold (Au) or silver (Ag) atom), and forming a covalent bond such as Au—S—X or Ag—S—X. Similarly, if the first functional group A1 is a disulfide group ($X_1$—S—S—$X_2$), covalent bonds such as Au(—S—$X_1$)(—S—$X_2$) or Ag(—S—$X_1$)(—S—$X_2$) are formed, thereby obtaining a strong bond.

If the first functional group A1 includes an azole compound or an azine compound, noncovalent electron pairs of nitrogen atoms in the components of these compounds can form coordinate bonds with metals that can be double valent or greater cations. This is favorable since, for example, imidazole compounds, benzotriazole compounds, and triazine compounds readily form coordinate bonds with metals such as Cu.

Note that covalent bonds, coordinate bonds, hydrogen bonds etc. can be formed simultaneously depending on the type of the compound. Even stronger bonds can therefore be achieved since two or more types of bonds are formed.

(Purine Skeleton B1)

A purine skeleton has a condensed cyclic structure of a five-membered ring and a six-membered ring, as has been mentioned in the above.

If the purine skeleton B1 forms a fluoride, the infiltration of water between the wiring lead 3 and the organic coating is suppressed to a great degree when the organic coating has been formed since the organic coating exhibits a strongly hydrophobic property. This is favorable since preferable bonding between the organic coating and the wiring lead is maintained, and detachment of the organic coating due to so called thermal history does not readily occur.

Thermal resistance and weatherability properties can be achieved if a siloxane chain is attached to the purine skeleton B1. This enables the effect of preventing deformation and damage to the organic coating even if exposed to a relatively high temperature environment in, for example, an implementation step of semiconductor elements etc.

(Second Functional Group C1)

It is required that the second functional group C1 have a resin hardening property or a resin-hardening promoting property for thermosetting resin. The second functional group C1 may be any chemical structure as long as the above properties are ensured.

For example, the second functional group C1 may be one selected from the group consisting of a hydroxyl, a carboxylic acid, an acid anhydride, a primary amine, a secondary amine, a tertiary amine, an amide, a thiol, a sulfide, an imide, a hydrazide, an imidazole, a diazabicycloalkene, an organophosphine, and a boron trifluoride amine complex. Alternatively, the second functional group C1 may also be a compound containing at least one selected from the above group.

When such second functional group comes in contact with the thermosetting resin, a hardening reaction instantly occurs, thereby bonding the second functional group C1 and the resin together.

If the second functional group C1 is a primary amine, the second functional group C1 acts as an epoxy resin hardening agent which hardens the epoxy resin when there is contact with the epoxy resin, and forms a bond by cross polymerization with the epoxy groups in the epoxy resin.

If the second functional group is a 1,8-diazabicyclo(5.4.0) undecene-7 (DBU), which is a compound containing diazabicycloalkene, the second functional group C1 acts as a hardening promoting agent for the epoxy groups in the epoxy resin and hydroxyls, acid anhydrides etc., thereby accelerating the polymerization reaction of the epoxy groups and the hydroxyls, acid anhydrides etc.

3. Manufacturing Method for the Semiconductor Device

The following is a description of a manufacturing method for the semiconductor device 10 of embodiment 2.

The semiconductor device 10 is manufactured by performing an organic coating formation step of depositing the organic coating 110 on predetermined surfaces of the die-pad 3a, and thereafter performing a resin adhesion step of resin-sealing the die-pad 3a, the semiconductor chip 4, and the like.

[Organic Coating Formation Step]

Figure 10A:
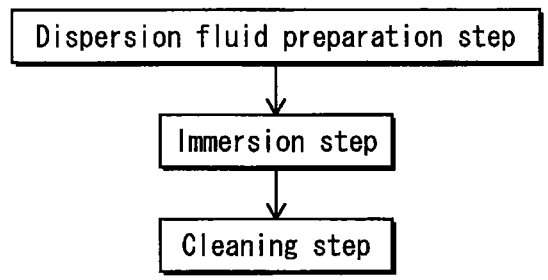
FIGS. 10A and 10B show a film formation processing for an organic coating pertaining to embodiment 2.

The organic coating formation step includes a dispersion fluid preparation substep, a film formation substep, and a cleaning substep performed in the stated order (FIG. 10A).

(Dispersion Fluid Preparation Substep)

The dispersion fluid is prepared by dispersing the functional organic molecules 111 in a predetermined solvent. The solvent may be an organic solvent and/or water. When water is used as the solvent, it is preferable to add an anion series, cation series, or noion series surfactant as necessary in order to obtain dispersibility of the functional organic molecules 11. Furthermore, a boric acid series, phosphoric acid series, or other pH buffering agent may be added in order to stabilize the functional organic molecules 111.

(Film Formation Substep)

Next, the predetermined surfaces of the die-pad 3a are immersed in the prepared dispersion fluid.

In the dispersion fluid, each of the functional organic molecules 111 is at an energy level having relatively high Gibbs free energy, and is moving randomly in reactive directions due to interaction between molecules (so-called Brownian motion).

Figure 10B:
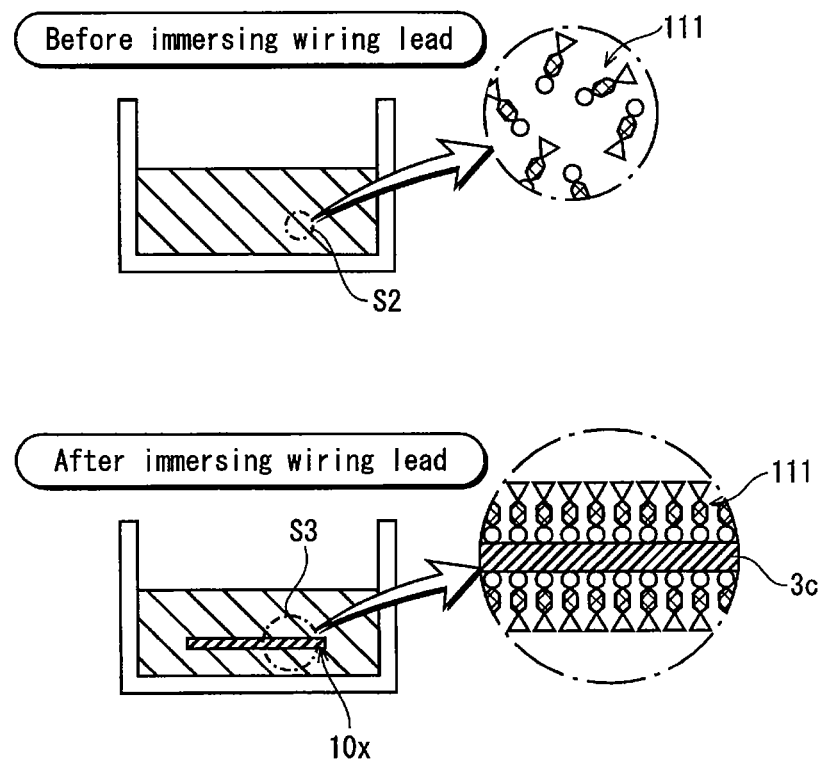

Consequently, when the die-pad 3a composed of a metal is immersed in the dispersion fluid, the functional organic molecules attempt to transition to a more stable state and thus, form metallic bonds with the die-pad 3a by the first functional group thereof. As a result, each of the functional organic molecules 111 stabilize in a state where the purine skeleton B1 and the second functional group C1 are aligned in the state order with respect to the surface of the die-pad 3a (FIG. 10B).

A single-molecule film is formed through the self-assembling of the functional organic molecules 111 according to the above principle. Hence, when the die-pad 3a is lifted out of the dispersion fluid, a member constituted from the die-pad 3a on which the organic coating 110 has been formed (hereinafter, called a "wiring member 10x") is obtained.

Note that although FIG. 10 describes an exemplary case in which the organic coating 110 is formed on all surfaces of the die-pad 3a, it may be conceived, of course, to place a pattern mask having apertures of a predetermined shape on the surface of the die-pad 3a, in which case the organic coating 110 is formed on only surface portions of the die-pad 3a that correspond to the apertures.

Note that although an immersion method using a dispersion fluid has been described above, the method of forming the organic coating 110 is not limited to this. For example, another method such as spraying may be used to form a similar organic coating 110.

(Cleaning Substep)

Cleaning processing is performed by using an organic solvent and/or water as a cleaning medium to remove excess functional organic molecules 111 from the wiring member 10x. The cleaning substep enables the simple removal of functional organic molecules 111 whose first functional groups A1 have not formed a metallic bond with the die-pad 3a. This completes the organic coating formation step.

[Resin Adheion Step]

The resin adhesion step includes a wiring member mounting substep and a resin filling substep which are performed in the stated order. The following describes each of these steps with reference to the schematic views of FIGS. 11A and 11B.

(Wiring Member Mounting Substep)

In the wiring member mounting substep, the wiring member 10x created in the organic coating formation step and the die-pad 3b are used. First, the semiconductor chip 4 is mounted to the die-pad 3b. The semiconductor chip 4 is connected to the wiring member 10x via a wire 5 etc. A resulting chip-attached wiring member 10y is placed on the fixed die 2 (FIG. 11A).

Next, a movable die 1 is moved in the direction of the arrows to close the dies 1 and 2.

At this time, an organic coating 110 having a single-molecular level thickness H1 and with a minute structure is formed on the surface of a wiring lead 3 of the chip-attached wiring member 10y, with the second functional groups C1 of the functional organic molecules 111 facing away from the surface of the wiring lead 3 (enlarged view of portion S4 of FIG. 11A). The area where the organic coating 110 has been formed includes areas that do not directly face cavities 1x and 1y (interior spaces) secured between the dies 1 and 2. In other words, the area of the organic coating 110 is a larger area than where the resin sealing is to be performed later.

(Resin Filling Substep)

The dies 1 and 2, which are in the closed state, are set to a predetermined heated condition. A fluid-state thermosetting resin material is injected into the cavities 1x and 1y at a fixed pressure via the gate 6. The resin material is filled mainly in the area including the semiconductor chip 4 of the chip-attached wiring member 10y until the cavities 1x and 1y are completely filled, and then hardens by receiving heat from the dies 1 and 2 (FIG. 11B). Formation of the sealing resin is complete once the resin material has completely hardened after a predetermined time, thereby yielding a semiconductor device 10z. The semiconductor device 10 is then completed by bending the outer leads 301a.

In this step, the resin material injected into the cavities 1x and 1y ("Intended resin mold area" of FIG. 11B), particularly the resin material coming into contact with the organic coating 110, is affected by the second functional group C1 (resin hardening effect or resin-hardening promoting effect), and hardens relatively quickly.

Therefore, even if there are unnecessary gaps between facing surfaces of the dies 1 and 2 at the periphery of the cavities 1x and 1y ("Area outside resin mold area" of FIG. 11B), the above effect causes the resin material to almost completely harden before leaking into the gaps. This enables effectively suppressing the formation of resin burrs in the gaps between the dies 1 and 2 (enlarged view of portion S5 in FIG. 11B).

Accordingly, it is possible to greatly reduce the occurrence of resin burrs on the outer leads 301a of the semiconductor device after formation of the sealing resin. Further, this eliminates the need for a separate processing step for removing resin burrs and enables a speedy transition to other steps such as for connecting the semiconductor device to another substrate, thereby realizing superior manufacturing efficiency.

Further, strong adhesion is obtained between the die-pad 3a and the molded resin body in the semiconductor device 10 manufactured by the aforementioned steps. Consequently, when the semiconductor device 10 is connected to another substrate, there is no resin detachment from the wiring lead due to heat damage, nor are there failures such as cracks.

Figure 23A:
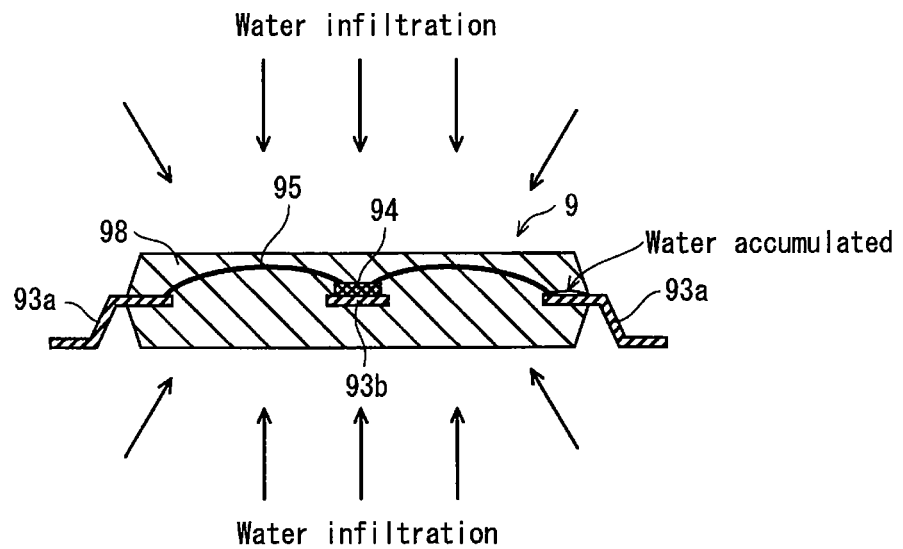
FIGS. 23A and 23B show a problem caused by insufficient adhesion between the wiring lead and the sealing resin according to conventional technology.
Figure 23B:
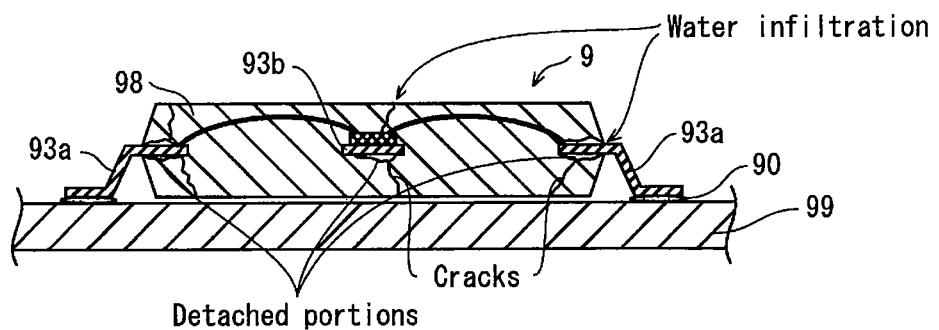

In the case of a conventional QFP 9 as depicted in FIG. 23A, there may be gap(s) between the facing surfaces of the molded resin 98 and the wiring lead 93 (93a, 93b). Thus, water infiltrated into the resin after production of the QFP 9 tends to be accumulated in the gaps by capillary action. When heat (about 260° C.) is applied for the reflow process to mount the QFP 9 in this state on a substrate, the accumulated water evaporates at once and undergoes rapid volume expansion. At this time, a considerable amount of water in the molded resin 98 cannot withstand the rapid volume expansion. As a result, one or more portions of the molded resin 98 each corresponding to a gap may be pealed from the wiring lead 93 to form detached portions or cracks each running from a gap to reach the outer surface of the molded resin 98 may be generated (FIG. 23B). Such detached portions and/or cracks tend to cause more impurities such as water to enter into the interior of the QFP 9 from the outside. Further, such impurities may cause rupturing or shorting of a circuit of the encapsulated semiconductor chip 94.

Even if visible damage as described above does not occur at the time of reflow, water accumulated in the gaps may eventually cause shorting or corrosion (caused by so-called migration) in the semiconductor chip 94 and thus result in operation failure.

In contrast, the semiconductor device 10 described above is provided with the wiring lead 3 whose surface is coated with the organic coating 110 composed of functional organic molecules 111 so that the adhesion between the wiring lead 3 and the resin body 121 is improved as compared with the conventional QFP. Therefore, even if water is infiltrated into the resin body 121, the water does not accumulate in between the wiring lead 3 and the resin body 121. Hence, the occurrence of cracks in the resin body 121 is prevented, even if processing involving a high temperature such as soldering of the wiring lead is applied thereto after completion of the manufacturing.

Also, since the organic coating 110 is a single-molecule film, the provision thereof causes almost no increase in the thickness of the semiconductor apparatus. There is also no problem of the volume of the organic coating causing a practical shortage of resin material to be filled into the cavities. As such, the excellent effects of the present invention can be obtained while using the same manufacturing facilities as in conventional technology.

Embodiment 3

In the present embodiment, description will be made on an LED device that includes a light emitting diode (LED) element.

Figure 12:
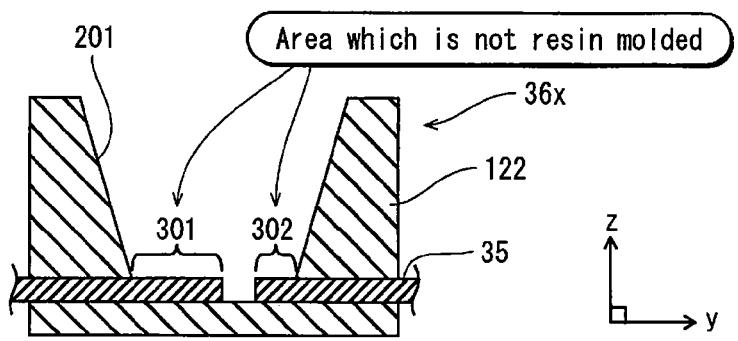
FIG. 12 shows a structure of an LED device pertaining to embodiment 3.

FIG. 12 is a schematic cross-sectional view showing a structure of a wiring lead 35 and a reflector 122 of an LED device unit 36x of embodiment 3.

The LED device unit 36x has a structure where a wiring lead 35 has been provided on a bottom portion of a mortar-shaped reflector 122. The reflector 122 is formed by resin-molding a thermosetting resin material (e.g., epoxy resin). Similarly, the reflector 122 may also be formed by using ceramics material.

Similar to embodiment 1, there is a possibility of resin burrs forming in the LED device unit 36x as well. Specifically, areas 301 and 302 of the wiring lead 35 that are exposed at the bottom of the reflector 122 must retain electrical conductivity since an LED chip 42 is to be mounted thereupon later (refer to FIG. 13B). However, resin burrs can form on the exposed areas 301 and 302, by resin material flowing out from the bottom edges of the reflector 122 through gaps between the dies for resin molding.

Another processing step for removing the resin burrs is therefore necessary, and the LED cannot be mounted with favorable manufacturing efficiency.

This problem can be appropriately addressed by forming the organic coating 110 composed of the functional organic molecules 111 of the present invention on at least the exposed areas 301 and 302 of the wiring lead 35 before the resin adhesion step. This enables speedily hardening of the thermosetting resin material during resin molding. Hence, the leaking of resin material from the bottom edges of the reflector 122 is prevented, and thus, the aforementioned problems pertaining to the occurrence of resin burrs is resolved.

Additionally, the formation of the organic coating 110 composed of the functional organic molecules 111 on the exposed areas 301 and 302 of the wiring lead 35 before the resin adhesion step prevents the occurrence of wire disconnection in the bonding of a wire 52 to the wiring lead 35, and thus improves the reliability of wire bonding.

The resin material for forming the reflector 122 may be a thermoplastic resin, such as silicone resin, PPA (polyphthalamide resin) or LCP (liquid crystal polymer), instead of the thermosetting resin described above.

Such thermoplastic resin contains various additives mixed therein. Examples of the additives include thermostabilizer, light stabilizer, filler, mold lubricant, and white pigment. At the time of injection molding of the thermoplastic resin material fused by heat, volatile components present in the resin material including the additives described above are released as outgas into the atmosphere. Among such outgases released, the outgas components derived from the mold lubricant and base resin involve the risk of forming a thin film (impurity film) when adhered to the surface of the wiring lead. The presence of such an impurity film on the surface of the wiring lead will inhibit proper bonding between the wire tip and the wiring lead at the time of wire bonding. Even if the bonding is made, the bonding strength may be insufficient. In such a case, slight vibrations made thereafter may cause wire disconnection. Note that the presence of an impurity film may be checked by SEM, for example.

In view of the above risk, the present invention provides formation of the organic coating 110 composed of the functional organic molecules 111, see FIG. 10B, on the surface of the exposed regions 301 and 302 of the wiring lead 35. By virtue of the organic coating 110, outgas components as stated above are inhibited from coming into direct contact with the surface metal of the wiring lead 35, and hence the forming of an impurity film on the exposed regions is prevented.

Here, it is noted that the outgas components derived from the mold lubricant and base resin are hydrophobic (lipophilic). In contrast, the second functional groups C2 disposed on the surface of the organic coating 110 exhibit hydrophilicity. Thus, the hydrophobic outgas components moving toward the organic coating 110 are repelled toward outside by the second functional groups C2. By virtue of this, the formation of an impurity film on the wiring lead 35 is further prevented.

On the other hand, the following is noted regarding the wire 52 to be bonded to the wiring lead 35 via the organic coating 110. The thickness of the organic coating 110 is equal to the length of a single molecule of the functional organic molecules 111, whereas the diameter of the wire 52 is about 25 μm, which is relatively very thick (about 2500 times the thickness of the organic coating). Therefore, at the time of bonding, the functional organic molecules 111 present in the bonding region is easily removed by the heat caused in the reflow process. In other words, it may be considered that the molecules having been removed from the bonding region are diffused and melts into the bonding metal present in the wire. As a result, the wire 52 is appropriately bonded to the wiring lead 30.

In short, the present invention avoids failures in wire bonding caused by outgas components and achieves higher bonding reliability by forming the organic coating 110 on a region 302 of the wiring lead 35 to which wire bonding is performed.

Note that an organic coating covering an intended region on the surface of the wiring lead 35 is formed by appropriately masking the wiring lead 35 using a known method and immersing the masked wiring lead 35 into the dispersion fluid shown in FIG. 10B.

Further, in the case where an Ag plating coat is formed on the surface of the wiring lead 35, an organic coating may be additionally provided on the plating coat. The organic coating serves to protect the Ag plating coat from a reactive gas and/or catalysts that may be present in the ambient atmosphere, so that original reflectivity of the Ag plating coat is maintained and an LED device with excellent luminous efficiency is realized.

Modifications of Embodiments 2 and 3

The hardening promoting effect for thermosetting resin of the organic coating 110 in embodiments 2 and 3 can also be used to securely form a fine resin pattern.

For example, in the technological field of performing localized resin molding on a portion of a wiring substrate surface applying such method as an inkjet method, there is a case in which precise resin molding is required. In this case, first forming the organic coating enables faster resin molding than can be performed in a case of performing resin molding directly on the wiring lead 35. Further, in such a case, resin dripping and loss of resin shape after application do not readily occur since time required for the hardening of the resin is short. This enables accurate resin molding according to precise patterns as planned.

Also, the organic coating 110 of embodiments 2 and 3 is not limited to being formed directly on the die-pad and the wiring lead. For example, a plating coat may be formed on the surfaces of the die-pad and the wiring lead beforehand, and the organic coating may be formed thereupon. However, in this case the functional groups must be selected such that the first functional group A1 has bonding properties with the plating coat.

Embodiment 4

The following is a description of embodiment 3 of the present invention focusing on differences from embodiment 2.

(Structure and Effects of LED Device)

Figure 13A:
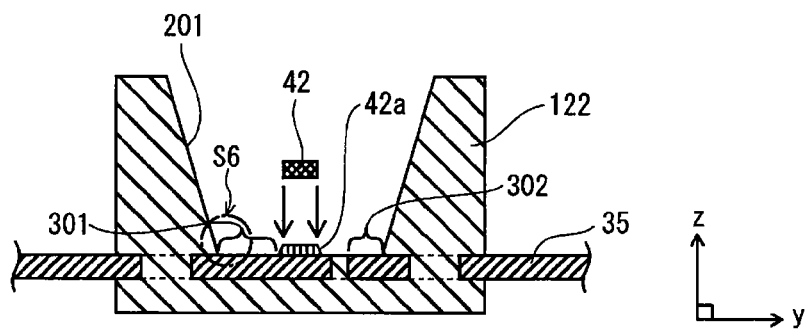
FIGS. 13A through 13C show a structure of and manufacturing processing for an LED device pertaining to embodiment 4.
Figure 13B:
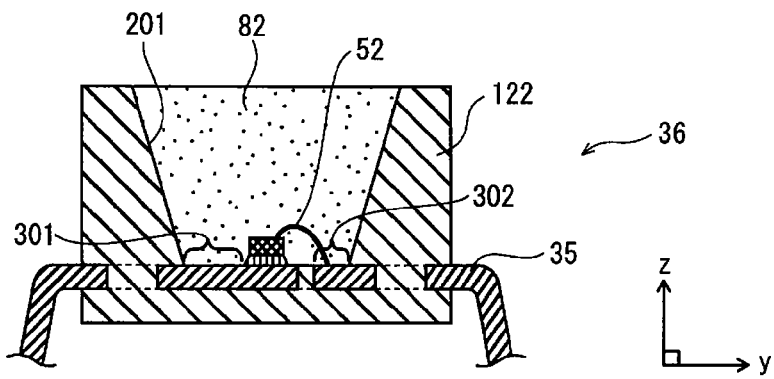
Figure 13C:
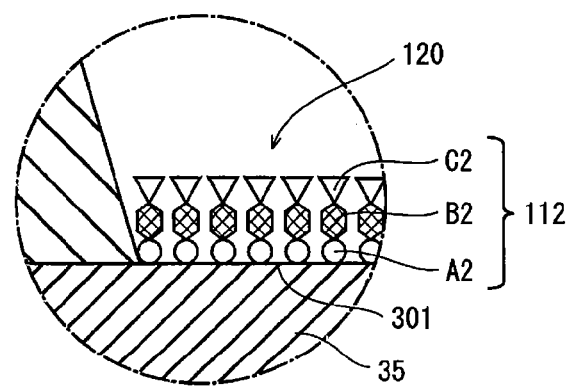

FIGS. 13A through 13C are cross-sectional views showing a structure of and manufacturing steps for an LED device 36.

The LED device 36 basically includes the device unit 36x of embodiment 3, and as shown in FIG. 13B, further has a structure in which an LED chip 42 is adhered, via a paste 42a, on the wiring lead 35 surrounded by the reflector 122. The LED chip 42 is connected to the wiring lead 35 via a wire 52.

A transparent sealing resin 82 is filled into the reflector 122 on a reflector surface 201 and exposed areas 301 and 302 thereof so as to seal the LED chip 42 and the like.

Silicone resin, which is one example of a thermosetting resin, is used as the sealing resin 82 herein.

In embodiment 3, an organic coating 120, which is composed of a single-molecule film formed through the self-assembly of functional organic molecules 112, has been formed on the surface of the exposed areas 301 and 302 of the wiring lead 35. The functional organic molecules 112 have a characteristic feature in which a first functional group A2 having a metal bonding property is provided at one end of a purine skeleton B2, and a second functional group C2 having a resin bonding property for silicone resin is provided at the other end of the purine skeleton B2 (FIG. 13C).

Although generally having superior anti-discoloration properties and transparency over epoxy resin and the like, silicone resin readily deforms under high temperatures due to having a high thermal expansion coefficient, and there is the fear that such deformation will cause the silicone resin to be peeled and detached from the wiring lead 35.

In contrast, in embodiment 4, the presence of the organic coating 120 composed of the functional organic molecules 112 between the wiring lead 35 and the silicone resin causes a significant improvement in adhesion therebetween, and eliminates peeling and detachment even if the silicone resin is somewhat deformed by heat etc.

This achieves stable functioning of the LED device 36 even in high temperature environments and during long periods of operation.

In addition, failures caused by outgases in the bonding of the wire 52 to the surface region 302 of the wiring lead 35, as description has been made in embodiment 3, is similarly addressed by embodiment 4. In short, the organic coating 120 composed of the functional organic molecules 112 is formed on the exposed region 302 of the wiring lead 35, thereby avoiding problems caused by outgas and achieving enhanced wire bonding reliability.

(Structure and Manufacturing Method of the Functional Organic Molecules 112)

The same first functional group A1 and purine skeleton B1 of embodiment 2 can be used as the first functional group A2 and purine skeleton B2, respectively, in the functional organic molecules 112 of embodiment 4.

The second functional group C2 is a compound, a chemical structure, or a derivative that has a hardening property for thermosetting resin, and in particular for silicone resin. Specifically, the second functional group C2 may be a compound, a chemical structure, or a derivative that contains at least one of a vinyl group and an organohydrogensilane.

Further, in the case where the silicone resin includes an epoxy group or an alkoxysilyl group, the second functional group C2 may be a compound, a chemical structure, or a derivative containing at least one selected from the group consisting of a hydroxyl, an acid anhydride, a primary amine and a secondary amine.

Such a compound, a chemical structure, or a derivative having a bonding property for a corresponding one of an epoxy group and an alkoxysilyl group is more stable as compared to a vinyl group or organohydrogensilane and thus is effective to improve the stability and longevity of the organic coating.

Further, in order to improve the bonding to the second functional group C2, the resin component of the sealing resin 82 may additionally contain a hydrophilic additive having an epoxy group or an alkoxysilyl group as an agent improving the adhesion. With the addition of such an additive, the wiring lead 35 is securely bonded to the sealing resin 82. In addition, the same effects may be obtained by using a transparent resin material having a silicone resin modified with an epoxy group or an alkoxysilyl group, which is hydrophilic as the resin material of the sealing resin 82.

(Manufacturing Method for the LED Device)

The manufacturing method for the LED device can be implemented by successively performing the following steps. Note that with the exception of the organic coating formation step, a heretofore known manufacturing method for an LED device may be employed.

[Organic Coating Formation Step]

The organic coating 120 composed of the functional organic molecules 112 is formed as a self-assembled single molecule film on the surface of the wiring lead 35 in the same way as in the organic coating formation step of embodiment 2, thereby obtaining the wiring lead 35 having an organic coating formed thereupon.

[Resin Adhesion Step]

A thermoplastic resin material such as polyphthalamide resin is injected onto the wiring lead 35, which has the organic coating 120 formed thereupon, in the same way as in the injecting molding procedure shown in FIGS. 11A and 11B. Thereafter, cooling to a predetermined temperature range is performed to harden the resin. This forms the reflector 122 and obtains the LED device unit 36x.

Thereafter, the LED chip 42 is mounted on the wiring lead 35 via the paste 42a. The wiring lead 35 and LED chip 42 are connected via the wire 52.

Thereafter, the silicone resin material, which is in a fluid state, is filled into the reflector 122. The LED device 36 is then obtained by causing the resin to harden.

Embodiment 5

The following is a description of embodiment 5 focusing on differences from embodiment 4.

In embodiment 4, a functional group having a specialized chemical bonding property for silicone resin is selected as the second functional group C2 of the functional organic molecules 112 constituting the organic coating 120. However, embodiment 5 has a characteristic feature in that a functional group having a flash hardening property is selected as a second functional group C2' of functional organic molecules 112a (enlarged view of portion S7 in FIG. 14B).

Specifically, the second functional group C2' is at least one, a compound containing at least one, or a chemical structure containing at least one selected from the group consisting of a platinum complex, a palladium complex, a ruthenium complex, and a rhodium complex.

A manufacturing method of the LED device 36 of embodiment 5 is the same as the manufacturing method of embodiment 4, except for that the reflector 122 is formed by injection molding using a thermoplastic resin such as polyphthalamide resin.

Figure 14A:
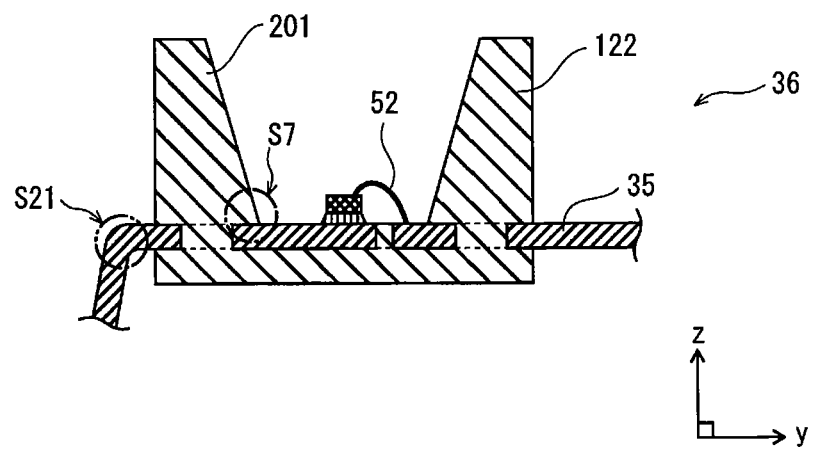
FIGS. 14A and 14B show a structure etc. of an LED device pertaining to embodiment 5.
Figure 14B:
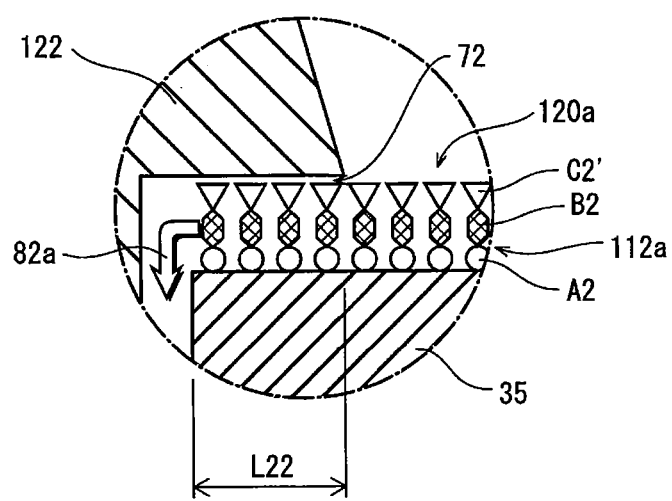

However, in the injection molding of the reflector 122, the thermoplastic resin is cooled and hardened, and there are cases in which the resin experiences volume shrinkage. In such cases, there is the possibility of a gap 72 forming between the wiring lead 35 and the reflector 122 (FIG. 14B).

Such a gap 72 invites excessive leaked resin 82a during filling of the silicone resin, and leads to a waste of resin material. The leaked resin 82a also leads to the degradation of the electrical connectivity of the outer lead portion of the wiring lead 35, thereby requiring a separate removal step and bringing about a reduction in manufacturing efficiency. Furthermore, the leaked resin 82a is undesirable in that its existence between the LED device and a heat sink (not depicted) attached to the back surface of the LED device 31 causes impairment of the radiation performance of the heat sink.

In contrast, in embodiment 5, a functional group having a flash hardening property is provided as the second functional group C2' of the functional organic molecules 112a, thereby causing the silicone resin that is filled into the reflector 122 to harden immediately after filling. As a result, solid silicone resin is formed quickly on the bottom portion of the mortar-shaped reflector 122, thereby plugging any gaps. This effectively prevents the silicone resin material that is filled into the reflector 122 in the successive step from flowing into the gaps. Accordingly, there is no need for a separate step for removing the leaked resin 82a, thereby enabling an improvement in manufacturing efficiency.

Furthermore, electrical conduction with external devices via the outer leads of the wiring lead 35 is not inhibited since the leaked resin 82a is not deposited on the outer leads. This enables highly reliable electric connection with the LED device 36 when electrical connection is established applying a method such as solder connection.

Also, preventing the leaking of silicone resin into the gaps enables suppressing the occurrence of voids (air bubbles) in the resin in the gaps, which further improves the sealing properties of the silicone resin.

Note that in order to favorably obtain the aforementioned effects, the area in which the organic coating 120a is provided is, as shown in the enlarged view of portion S7 in FIG. 14B, extended to cover area L22 which corresponds to a gap 72 between the reflector 122 and the wiring lead 35. This is preferable since, even if the leaked resin 82a flows to some extent into the gap 72, the resin hardens before the leak can expand to a larger extent, thereby preventing any further leaking.

Embodiment 6

The following is a description of embodiment 6 focusing on differences from embodiment 5.

An LED device of embodiment 6 has a characteristic feature in that a second functional group C3 of functional organic molecules 113 is a fluorescent or phosphorescent functional group, thereby improving luminous efficiency.

Figure 15A:
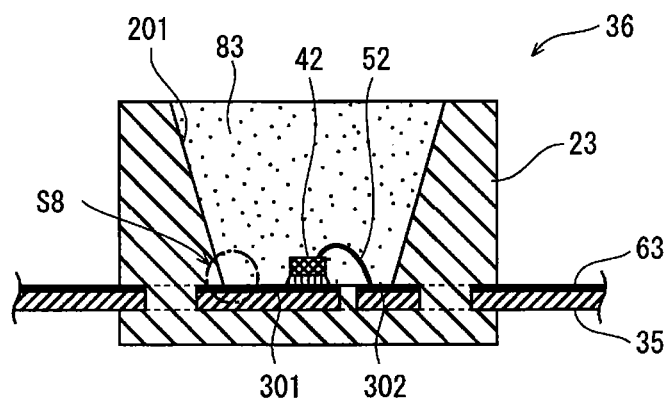
FIGS. 15A and 15B show a structure of an LED device pertaining to embodiment 6.

Conventionally, there are cases in which an Ag plating coat 63 (FIG. 15A) is provided to the surface of the wiring lead 35 for improving reflection of the wiring lead in order to effectively use light emitted from the LED chip 42. However, only light with a wavelength of approximately 500 nm or more is effectively reflected by Ag materials, and it is difficult to obtain effective reflectivity for light of shorter wavelengths (e.g., blue light and ultraviolet light with wavelengths of around 380 nm to 500 nm).

Figure 15B:
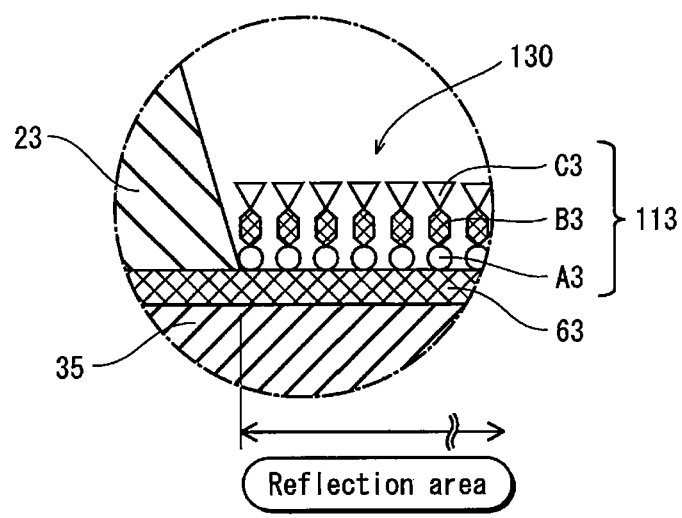

In contrast, in the present invention, an organic coating 130 is formed on the Ag plating coat 63 in areas thereof that correspond to the exposed areas 301 and 302 of the wiring lead 35. The organic coating 130 is composed of functional organic molecules 113 having a second functional group C3 that converts short wavelength light to fluorescent or phosphorescent light (enlarged view of S8 in FIG. 15B). This aims to supplement the efficiency with which visible light is reflected by the Ag plating coat 63.

The same first functional group A1 and purine skeleton B1 as description has been made in the above can be respectively used as the first functional group A3 and purine skeleton B3 in embodiment 6.

Specifically, according to the LED device 36 of embodiment 6 having the above structure, the long wavelength light components (light with wavelengths of approximately 500 nm or greater) of the light emitted by the LED chip 42 during operation is effectively and directly reflected toward the front of the chip by the Ag plating coat 63. At this time, the traveling of the long wavelength light is not hindered by the organic coating 130, which is due to the organic coating 130 being a single-molecule film only having a single-molecular thickness. Hence, the long wavelength light passes through the organic coating 130 and reaches the Ag plating coat 63, and furthermore is reflected by the Ag plating coat 63 without any problems.

On the other hand, the passing through of short wavelength light (light with a wavelength of approximately 380 to 500 nm) emitted by the LED chip 42 through the organic coating 130 is inhibited to a certain extent, since short wavelength light has a higher energy level than long wavelength light. However, the short wavelength light is absorbed by the outward-oriented second functional groups C3 of the functional organic molecules 113. The short wavelength light absorbed is used as light energy (E=hv) in the second functional group C3, and causes the energy level of the second functional group C3 to move to an excited state (E0→E1). As a result, the aforementioned light energy (E=hv) ultimately changes to fluorescent or phosphorescent light emitted from the second functional group C3. In other words, the short wavelength light emitted from the LED chip 42 is not actually reflected by the organic coating 130, but converted into visible light by the second function group C3.

As a result, light in both the short wavelength and long wavelength ranges emitted by the LED chip 42 effectively contributes to the luminous efficiency of the LED device 36. This enables the realization of an LED device 36 that is superior to conventional structures.

In addition, the light emitting properties of the LED chip 42 can be adjusted by combination of the visible light directly reflected by the plating coat and the light emitted by the functional group C3.

Further, note that embodiment 6 is also applicable to a structure in which a plating coat other than the Ag plating coat 63 is used. For example, light with a wavelength of approximately 600 nm or greater is effectively reflected if a gold plating coat is used. Therefore, visible light with a wavelength in the region of 600 nm is reflected by the gold plating coat. If light with a wavelength of approximately 600 nm to 700 nm is emitted as red fluorescent or phosphorescent light by the second functional group C3 to supplement the visible light reflected by the gold plating, an LED device 36 with an improved luminance with respect to red light will be yielded.
(Second Functional Group C3)

The second functional group C3 is a compound or a chemical structure having a fluorescent or phosphorescent light emitting property based on excitation by the aforementioned short wavelength light. For example, the second functional group C3 may be a bis-styrylbiphenyl derivative or other stilbene derivative, a bis(triazinylamino) stilbene sulfonic acid derivative or other azole-modified stilbene derivative, a coumarin derivative, an oxazole derivative, a pyrazoline derivative, a pyrene derivative, and a porphyrin derivative.

Embodiment 7

The following is a description of embodiment 7 focusing on differences from embodiment 4.

Figure 16A:
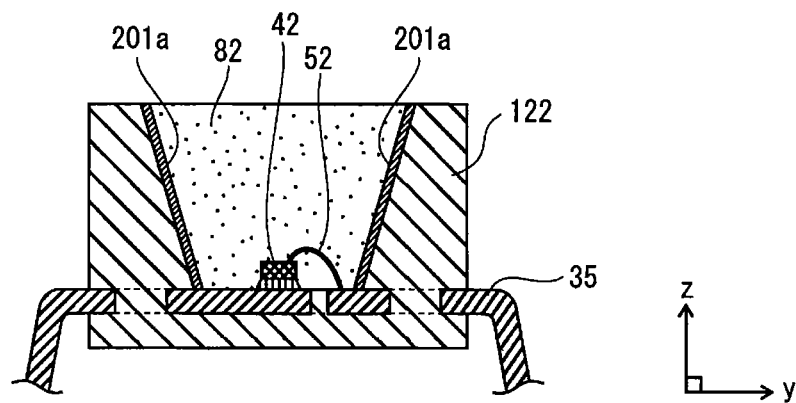
FIGS. 16A through 16C show a structure of an LED device pertaining to embodiment 7.
Figure 16B:
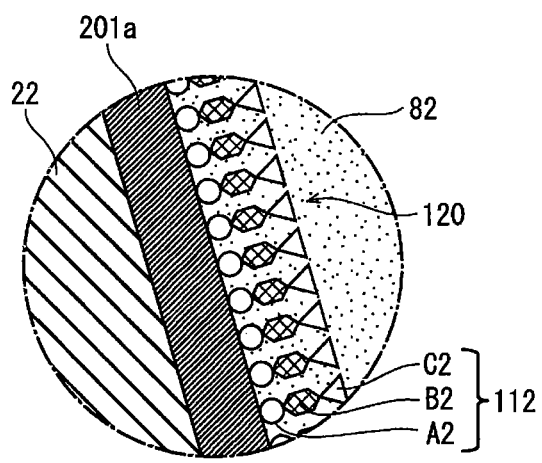

FIG. 16A is a cross-sectional view showing an LED device pertaining to embodiment 7.

Features of the LED device according to embodiment 7 are as follows. This LED device is based on the LED device according to embodiment 4, has an Ag plating coat 201a provided on the internal surface of the reflector 122, and also has an organic coating 120 further provided on the surface of the Ag plating coat 201a. The organic coating 120 is formed through self-assembling of the minutely arranged functional organic molecules 112.

With the provision of the Ag plating coat 201a, during operation of the LED device, light emitted from the side surfaces of the LED chip 42 is reflected by the Ag plating coat 201a. The reflected light is directed to exit the LED device from the front surface (toward the upward direction as viewed in the figure). Since the Ag plating coat 201a is highly reflective, an excellent luminous efficiency is achieved.

Further, with the provision of the organic coating 120 on the surface of the Ag plating coat 201a, alteration of the Ag plating coat 201a is prevented even if the Ag plating coat 201a is exposed to corrosive gas at the time of manufacturing the LED device. Consequently, good reflectivity is maintained.

More specifically, an Ag material is generally highly chemically reactive and thus easily reacts with various corrosive gases (for example, various components present in the thermoplastic resin material of the reflector 122) contained in the atmosphere at the time of manufacturing process or with catalysts (such as platinum group catalysts) that are necessary for addition polymerization of the silicone resin constituting the sealing resin 82. If Ag reacts with such corrosive gas or catalysts, the Ag plating coat undergoes discoloring or tarnishing and the reflectivity thereof becomes lower than the designed level. In such a case, even if the light emitting performance of the LED chip 42 is sufficient, the Ag plating coat cannot sufficiently reflect the emitted light. As a result, a problem arises that the overall luminance of the LED device decreases and thus the luminous efficiency thereof decreases.

A similar problem of a decrease of the luminous efficiency caused by reaction of a plating coat with a corrosive gas or catalysts may occur even if the plating coat is made of a material other than Ag.

In view of the above risks and problems, the LED device according to embodiment 7 is provided with the organic coating 120 disposed on the surface of the Ag plating coat 201a. The organic coating 120 is composed of the functional organic molecules 112 that are minutely arranged. Therefore, even if a corrosive gas or catalyst is present in the atmosphere at the time of manufacturing, the organic coating 120 serves as protection of the Ag plating coat 201a, so that direct contact between the Ag plating coat 201a and corrosive gas is avoided. Consequently, unnecessary chemical reaction of Ag is prevented, so that the Ag plating coat 201a maintains excellent reflectivity and thus an LED device with good luminous efficiency is yielded.

In addition, by virtue of the excellent reflectivity of the Ag plating coat, light emitted by the LED chip 42 is used with improved efficiency, which leads to a reduced risk that wasteful output accumulates as latent heat at locations around the Ag plating coat. That is, the LED device according to embodiment 7 achieves excellent luminous efficiency and increases longevity by preventing the LED chip 42 from damage caused by overheating. Further, the achievement of excellent luminous efficiency is advantageous for achieving compact packaging of the device.

In addition, in embodiment 7, functional organic molecules 112 are used to compose the organic coating formed on the surface of the Ag plating coat 201a. Since the second functional group C2 of each of the functional organic molecules 112 has a hardening property for thermosetting resin, especially silicone resin, the adhesion between the organic coating and the sealing resin 82 (silicone resin, for example) filled in the reflector 122 is improved.

Further, either one of or a mixture of the purine skeleton compounds according to embodiment 1, the functional organic molecules 111 according to embodiment 2, and the functional organic molecules 113 according to embodiment 5, in addition to the functional organic molecules 112, may be used to form an organic coating on the surface of the Ag plating coat 201a. In all cases, the reflectivity of the plating coat 201a is maintained at an excellent level.

Regarding the device according to embodiment 7, one example of a method of forming the organic coating 120 is to coat the organic molecules 112 exclusively on the surface of the Ag plating coat 201a by selectively masking the other surface.

Figure 16C:
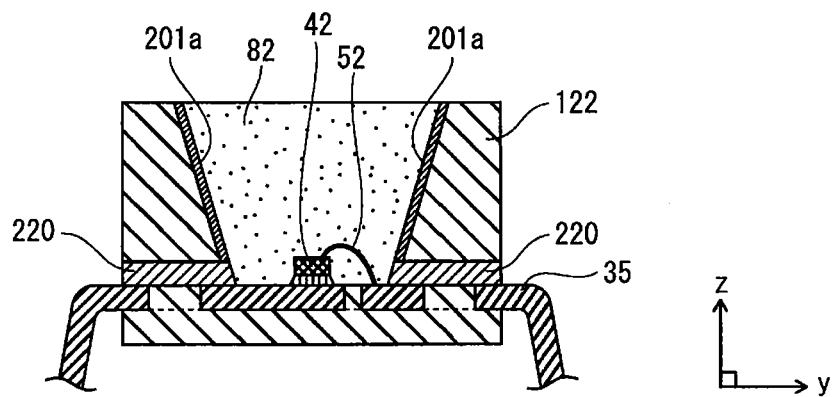

In another example, the reflector 122 is made of a different metallic material and independent from the wiring lead 35, as shown in FIG. 16C. Then, the Ag plating coat 201a is formed by conducting, for example, electrodeposition on a predetermined portion on the inner surface of the reflector 122. Then, the Ag plating coat 201a is immersed in a predetermined dispersion fluid as shown in FIG. 10B to form organic coating 120 on the entire surface thereof. Subsequently, the reflector 122 is fixed to the wiring lead 35 with an insulating adhesive resin 220 (which may be a resin or ceramics) to prevent shorting between the reflector 122 and the wiring lead 35. In this case, the organic coating 120 is formed to cover not only the surface of the Ag plating coat 201a but a relatively wide area of the entire inner surface of the reflector 122. Yet, this gives no problem in the resulting LED device.

Modifications of Embodiments 1 Through 7

The following additional effects can be achieved if the organic coating 110 etc. of the present invention is formed on the surface of the die-pad or the wiring lead.

In order to improve adhesion with resin (e.g., epoxy resin), there are cases in which roughening processing is performed on the surface of the wiring lead in a semiconductor device such as an IC, LSI, etc. to create better cling with the resin.

Also, an appearance examination is performed for quality management of manufactured semiconductor devices. Generally, such an examination is performed by a laser measurement method using a laser emitting apparatus and a photo receptor. However, when laser is irradiated to the roughened surface, the irradiated laser is diffusely reflected off of the roughened surface, thereby making it difficult to perform accurate measurement due to a reduction in the amount of light received by a photo receptor or the reception of unnecessary light. This problem becomes significant when an outward appearance is examined at a microscopic level using a weak laser.

In response to this problem, by forming the organic coating 110 of the present invention on the roughened surface of the die-pad and the wiring lead, the functional organic molecules contained therein absorb the laser light, preventing the diffuse reflection of the laser light caused by the unevenness in the rough surface. This makes it possible to efficiently and accurately perform the appearance examination step, and also to improve manufacturing efficiency for the semiconductor device. In addition, if the second functional group converts the light energy of the laser light to fluorescent or phosphorescent light and emits the fluorescent or phosphorescent light, the appearance examination step will be performed with even more improved efficiency.

Regarding the LED device, by performing die bonding using a conductive paste containing silicone resin, the LED chip 42 is securely bonded to the wiring lead 35. In addition, since the silicone resin containing conductive paste undergoes less degradation as compared with a conventional conductive past containing epoxy resin, the stabilization of electrical and thermal conductivity is duly expected.

Further, when performing die bonding of the LED chip 42 using an Ag paste, the organic coating according to the present invention may be provided to coat the surfaces of the Ag particles present in the Ag paste. With the provision of the organic coating, the Ag particles are prevented from making direct contact with platinum catalysts which are for addition polymerization of the silicone resin, or with unnecessary corrosive gas, so that alteration and discoloring of the Ag particles are suppressed. Consequently, the sealing resin 82 is maintained highly transparent, so that decrease in luminance is suppressed and appropriate operation of the LED device is ensured over a long period of time.

Embodiment 8

The following describes embodiment 8 of the present invention. Embodiment 8 pertains to film carrier tape such as TAB (Tape Automated Bonding) tape, T-BGA (Tape Ball Grid Array) tape, and ASIC (Application Specific Integrated Circuit) tape, which is used in the implementation of electrical parts of the IC, LSI, etc., and in particular to technology for improving the adhesion of a solder resist layer formed on the film carrier tape.

FIGS. 17A to 17D are schematic cross-sectional views showing a manufacturing process for a film carrier tape 400 of embodiment 8.

Figure 17A:
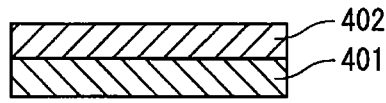
FIGS. 17A through 17D show manufacturing processing for a film carrier tape pertaining to embodiment 8.
Figure 17B:
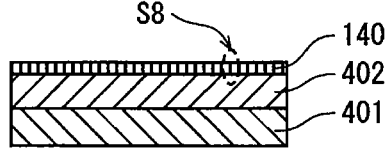
Figure 17C:
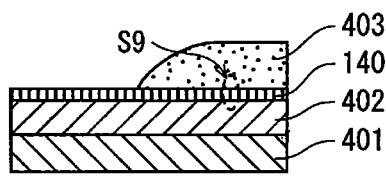
Figure 17D:
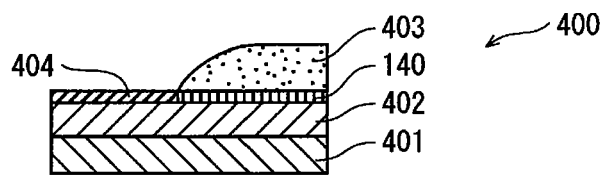

As shown in FIG. 17D, the film carrier tape 400 is constituted from an insulation film 401 composed of a polyimide or the like, a wiring pattern layer 402 composed of Cu, and a solder resist layer 403. The film carrier tape 400, the insulation film 401, the wiring pattern layer 402, and the solder resist layer 403 are laminated in the stated order.

The insulation film 401 and the solder resist layer 403 are constituted from an insulating resin material (e.g., a polyimide series, epoxy series, or urethane series resin), and are provided as insulation for preventing short-circuits of the wiring pattern layer 402.

An Sn plating layer 404 has been formed on the surface of the wiring pattern layer 402. An Sn material is preferable due to having solder wettability, flexibility, and lubricating properties, and being able to form a plating layer 404 suitable for use in the film carrier tape which is to be connected to implementation parts by soldering.

When forming the Sn plating layer 404 in the film carrier tape 400, the insulation film 401, the wiring pattern layer 402, and the solder resist layer 403 are first laminated in the stated order. Subsequently, the intermediate product obtained is immersed in an Sn plating tank filled with an Sn plating fluid (e.g., an Sn-containing compound dissolved in BF4 solvent) that has been heated to a predetermined temperature, and an electrolytic plating method or the like is used to form an Sn plating in an Sn plating step. The Sn plating layer 404 is selectively formed on the wiring pattern layer 402 due to tin component's property of not adhering to the insulating material.

Here, a characteristic feature of embodiment 8 is that, prior to the Sn plating step as described above, an organic coating 140 has been formed on the wiring pattern layer 402 by the self-assembly of functional organic molecules 114.

Figure 18A:
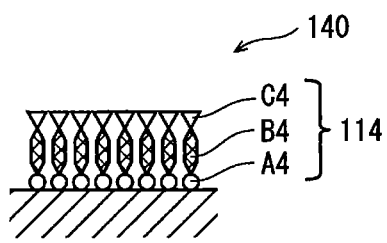
FIGS. 18A and 18B are structural views showing a periphery of a functional organic molecule.

As shown in FIG. 18A, each of the functional organic molecules 114 has a structure including a purine skeleton B4, a first functional group A4 having a metal bonding property at one end of the purine skeleton B4, and a second functional group C4 at the other end of the purine skeleton B4. The second functional group C4 is a functional group having a high degree of adhesion to the solder resist layer 403. The second functional group C4 is, for example, an acid anhydride such as a phthalic anhydride and a pyromellitic acid dianhydride, or a primary amine compound. Alternatively, the second functional group may be a compound containing at least one of an acid anhydride and a primary amine, and a chemical structure containing at least one of an acid anhydride and a primary amine.

Figure 18B:
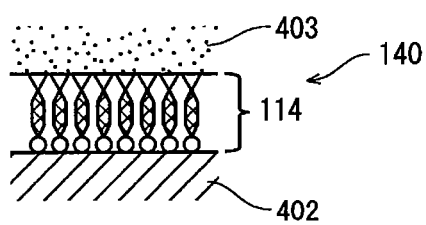

Since the organic coating 140 having such characteristics as stated above is coated to the surface of the wiring pattern layer 402, the wiring pattern layer 402 and the solder resist layer 403 are securely adhered together via the organic coating 140 as shown in FIG. 18B. Accordingly, edges of the solder resist layer 403 do not peel off of the wiring pattern layer 402 even during the Sn plating step involving immersion in the Sn plating tank heated to a predetermined temperature. This has the effects of preventing peeling of the solder resist layer 403, and enabling the formation of a favorable Sn plating layer 404.

Figure 24A:
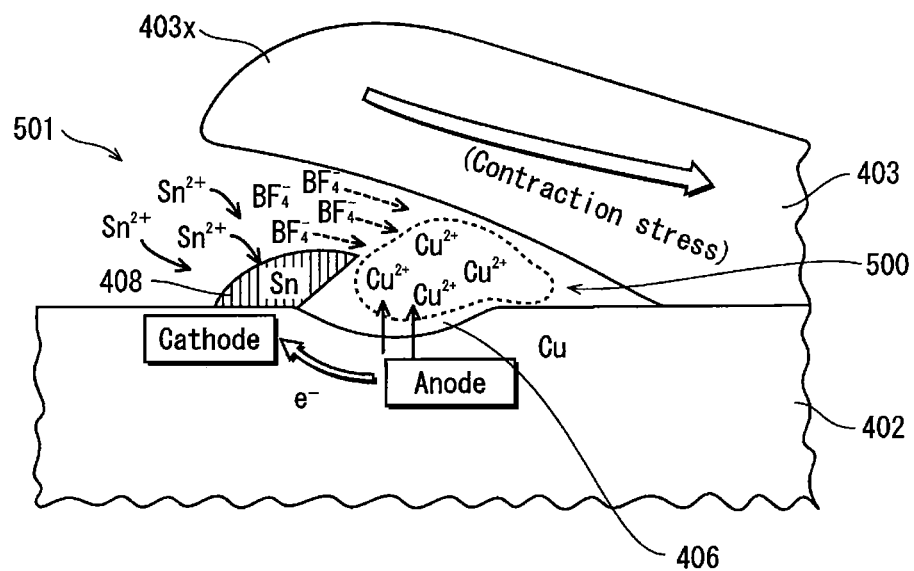
FIGS. 24 and 24B are schematic views of a local, electric cell formation process and a structure of a film carrier tape according to conventional technology.

Embodiment 8 also has the effects of suppressing the formation of a so-called local electric cell on the wiring pattern layer 402, and preventing corrosion of the surface thereof. The following describes the pertaining principle with use of the schematic enlarged view of FIG. 24A showing a vicinity of the wiring pattern layer 402 and the solder resist layer 403 during the plating step.

The solder resist layer 403 and the wiring pattern layer 402 each have unique linear expansion coefficients arising from the respective properties of the materials composing each of the layers. Due to this, during the hardening of the solder resist, the solder resist layer 402 experiences thermal contraction. As a result, internal stress is generated in each of the layers.

Here, assumption is made that the plating fluid in the plating tank is heated to approximately 60° C.

When the wiring pattern layer 402 having the solder resist layer 403 layered thereon is inserted in the plating fluid, the solder resist layer 403, which has higher internal stress than the wiring pattern layer 402, experiences a relatively large degree of thermal expansion. Accordingly, an edge 403x of the solder resist layer 403 peels up off of the surface of the wiring pattern layer 402.

When this state occurs, the edge 403x then further lifts up due to remaining thermal contraction forces (internal stress) in the solder resist layer 403 since the plating fluid enters between the edge 403x and the wiring pattern layer 402. Accordingly, a solvent area 500 is formed between the raised edge 403x and the wiring pattern layer 402.

Further, since there being differences in the ionization tendencies of Sn and Cu, Cu ions from the surface of the wiring pattern layer 402 seep into the solvent in the solvent area 500 due to a sparse amount of Sn ions in the solvent area 500.

Concurrently with the seeping of Cu into the solvent, electrons that are released from the wiring pattern layer 402 when the Cu ions appear are received by the Sn ions in the plating fluid, and an Sn deposition layer 408 composed of deposited Sn is formed on the wiring pattern layer 402 in an area directly below the edge 403x of the solder resist 403.

In short, a so-called local electric cell is formed due to a series of oxidation-reduction reactions between the tin and copper (see Japanese Patent No. 3076342 for details of the formation process for the local electric cell).

Figure 24B:
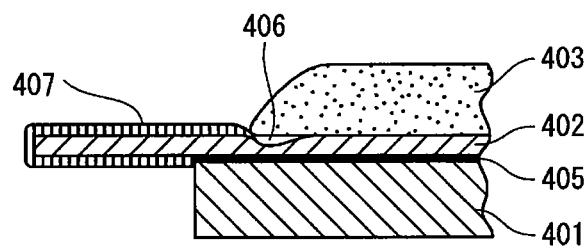
Figure 25A:
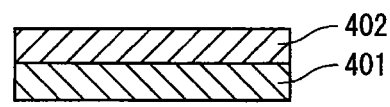
FIGS. 25A through 25D show the structure of a conventional film carrier tape having two layers of Sn plating.
Figure 25B:
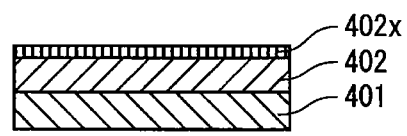
Figure 25C:
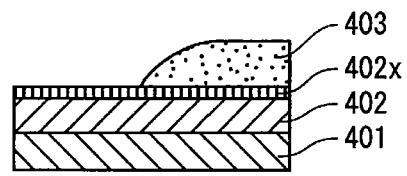
Figure 25D:
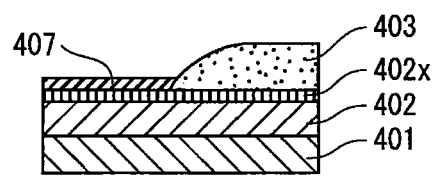

As the local electric cell reaction progresses even further, the portion into which the Cu ions seeped becomes a corroded area 406. The corroded area 406 thereafter remains underneath the edge 403x while being hidden from sight (FIG. 24B). The corroded area 406 does not stand out visually, but failures such as ruptures in the film carrier tape can originate at the corroded area 406 when there are pulling forces etc. during manufacturing steps that use the film carrier tape.

In contrast, in embodiment 8, since the solder resist layer 403 and the wiring pattern layer 402 are securely adhered via the organic coating 140, the edge 403x does not peel off of the wiring pattern layer 402 during the plating step, even if, for example, there is some degree of internal stress in the solder resist layer 403 with respect to the wiring pattern layer 402.

The formation of the corroded area 406 can therefore be avoided since the solder resist layer 403 does not peel off of the wiring pattern layer 402.

Accordingly, embodiment 8 enables the formation of a favorable Sn plating layer 404, and furthermore enables the realization of a film carrier tape with superior mechanical strength.

Also, note that the internal stress remaining in the solder resist layer 403 can be eliminated by performing post-processing such as an ordinary annealing processing after the plating step.

Further, note that Japanese Patent No. 3076342 discloses a technology for preventing the formation of the corroded area 406 by, as shown in FIGS. 25A to 25D, forming a first Sn plating layer 402x including a Cu component on the surface of the wiring pattern layer 402 before the provision of the solder resist layer 403, and thereafter forming the solder resist layer 403 and a second Sn plating layer 407. This technology makes possible the prevention of the formation of the corroded area 406, but requires for the plating step to be performed twice. The present invention has significant differences from the aforementioned technology in that there is no need to perform the plating step twice, which simplifies the manufacturing process and reduces the amount of plating fluid used and drainage thereof. Further, this has the effect of reducing manufacturing costs and alleviating environmental problems.

(Manufacturing Method for the Film Carrier Tape)

The following describes a manufacturing method for the film carrier tape 400 of embodiment 8.

First, the wiring pattern layer 402 (Cu foil) having a predetermined shape is formed on the insulation film 401 using a photoetching method or the like (FIG. 17A).

Next, in the organic coating formation step, the organic coating 140 composed of a single-molecule film is formed through the self-assembling of the functional organic molecules 114 deposited on the wiring pattern layer 402 (FIG. 17B, enlarged portion S8 of FIG. 18A).

Then, in the solder resist layer formation step, the solder resist layer 403 is formed by applying a solder resist material paste to the organic coating 140 using a printing method or the like (FIG. 17C). At this time, the second functional group C4 causes the solder resist material to harden, thereby forming a chemical bond therebetween (enlarged portion S9 of FIG. 18B).

Subsequently, the organic coating 140 in areas other than the formation area of the solder resist layer 403 is removed. Note that masking may be performed in the areas other than the formation area of the solder resist layer 403 prior to the formation of the organic coating 140, in place of performing the removal processing.

Then, the Sn plating layer is formed on a predetermined area on the wiring pattern layer 402 by immersion of the organic coating 140 and the resist layer 403 in the Sn plating tank (FIG. 17D). The Sn plating layer is formed only on conductive material surfaces by using an electroless substitution plating method. This completes the formation of the film carrier tape 400.

Embodiment 9

(Structure and Effects of the Film Carrier Tape)

The following describes a film carrier tape 400 of embodiment 9, focusing on differences from embodiment 8.

Figure 19A:
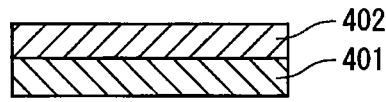
FIGS. 19A through 19D show manufacturing processing for a film carrier tape pertaining to embodiment 9.
Figure 19B:
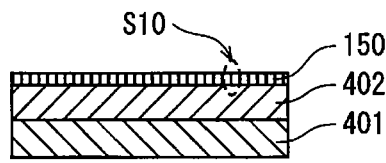
Figure 19C:
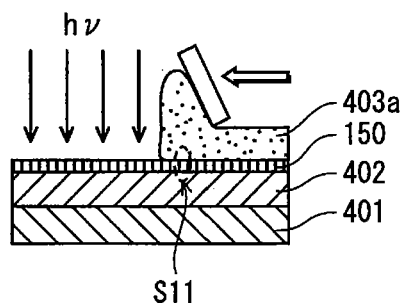
Figure 19D:
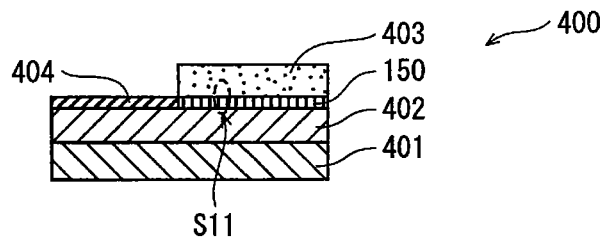
Figure 20A:
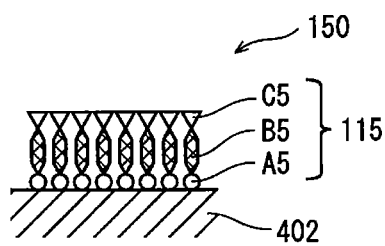
FIGS. 20A and 20B are structural views showing a periphery of the functional organic molecule.
Figure 20B:
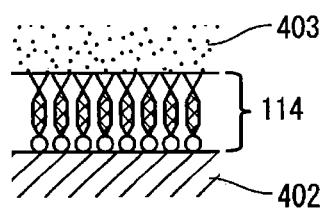

A characteristic feature of the film carrier tape 400 shown in FIG. 19D is that the wiring pattern layer 402 and the solder resist layer 403 have been bonded together using functional organic molecules 115 that include a second functional group C5 having a photopolymerization initiating property or a photosensitive property (enlarged view of S11 in FIG. 20B).

The second functional group C5 is, for example, selected from the group consisting of a benzophenone, an acetophenone, an alkylphenone, a benzoin, an anthraquinone, a ketal, a thioxanthone, a coumarin, a halogenated triazine, an halogenated oxadiazole, an oxime ester, an acridine, an acridone, a fluorenone, a fluoran, an acylphosphine oxide, a metallocene, polynuclear aromatic compounds, a xanthene, a cyanine, a squalium, an acridone, a titanocene, and a tetraalkyl thiuram sulfide. Alternatively, the second functional group C5 may be a compound containing at least one selected from the above group, or a chemical structure containing at least one selected from the above group.

Note that the second functional group C5 is not limited to such compounds and chemical structures, and any compound may be applied as long it has a photo-excited polymerization initiating property or a photosensitive property.

Embodiment 9, in which the plating step is performed under a condition where the functional organic molecules 115 is bonding the wiring pattern layer 402 and the solder resist layer 403, has the same effect as embodiment 8, that is to say, preventing the peeling of the solder resist layer 403 from the wiring pattern layer 402.

Additionally, the application of the solder resist material while exciting a photopolymerization initiating agent quickly hardens the solder resist material to form the solder resist layer. This prevents dripping and loss of resin shape, and enables the formation of the solder resist layer 403 having an accurate and precise pattern.

Specifically, the solder resist material paste is provided in a fluid state set to a predetermined viscosity, and is applied along a pattern mask disposed on the wiring pattern layer 402 beforehand. The mask is removed after predetermined drying, but the paste has a tendency of slightly spreading even after removal of the mask. For this reason, even if an assumption is made of the degree of spreading beforehand, and the paste is applied to an area that is somewhat smaller than the patterning mask, there is one problem that the edges of the paste form acute angles and readily peel off during the plating step.

In contrast, in embodiment 9, the organic coating is exposed to ultraviolet radiation directly before application of the paste, thereby providing the second functional group C5 with light energy ($E=h\alpha$), which enables causing the paste to harden quickly. This eliminates the formation of the acutely angled edges, such as in conventional technology. Further, the paste can be applied accurately to the patterning mask since there is little flow in the paste, which has the benefit of enabling the formation of a solder resist layer with a highly precise shape.

(Manufacturing Method for the Film Carrier Tape)

First, the predetermined wiring pattern layer 402 (Cu foil) is formed on the insulation film 401 using a photoetching method or the like (FIG. 19A). Next, the organic coating 140 composed of a single-molecule layer is formed through the self-assembling of the functional organic molecules 115 that have been deposited on the wiring pattern layer 402 (FIG. 19B, enlarged view of S10 in FIG. 20A).

Then, the organic coating 140 is exposed to ultraviolet radiation of a predetermined wavelength (e.g., approximately 340 nm or greater). This moves the second functional groups C5 on the surface of the organic coating 140 from their base state to an excited state ($E0 \rightarrow E1$). The paste material for forming the solder resist layer is applied in a predetermined thickness using a blade BL during a period in which the excited state is maintained (FIG. 19C).

Accordingly, the excitation energy of the second functional groups C5 is transferred to the solder resist as thermal energy, thereby causing thermosetting of the solder resist. This completes the manufacture of the film carrier tape 400 (FIG. 19D).

Embodiment 10

The following is a description of embodiment 10 focusing on differences from embodiments 8 and 9.

In embodiment 10, the organic coating is formed on the wiring pattern layer 402 using the same functional organic molecules 115 as in embodiment 9. A characteristic feature of embodiment 10 is that a batch process is used when forming the solder resist layer 403.

This has the benefits of, similar to embodiment 9, strengthening the bond between the solder resist layer 403 and the wiring pattern layer 402. In addition, the thickness of the solder resist layer 403 can be prepared over a wider range than is possible using a common printing method. This makes it possible to flexibly accommodate modifications in design.

FIGS. 21A to 21E show a manufacturing process for the film carrier tape 400 of embodiment 10.

Figure 21A:
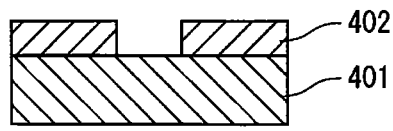
FIGS. 21A through 21E show a manufacturing processing for a film carrier tape pertaining to embodiment 9.

First, the wiring pattern layer 402 is formed in a predetermined pattern on the insulation film 401 (FIG. 21A).

Figure 21B:
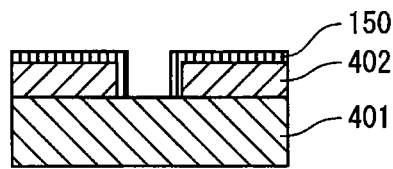

Next, in the organic coating formation step, the organic coating 150 is formed on the surface of the wiring pattern layer 402, thereby yielding an intermediate product (FIG. 21B). The formation of the organic coating in this step can be performed in substantially the same way as in embodiment 2.

Then, a resin dispersion fluid is prepared by dispersing a photopolymerizing compound, which is to form the solder resist material, in a solvent. The photopolymerizing compound may be a monomer and/or an oligomer of such compounds as a compound containing an acrylate group in a molecular structure, a compound containing a methacrylate group in a molecular structure, a compound containing an acrylamide group in a molecular structure, a compound containing a urethane group in a molecular structure, a compound containing an isocyanate group in a molecular structure, and a compound containing a vinyl group in a molecular structure. After preparation thereof, the resin dispersion fluid is filled into a batch of a predetermined solution.

Figure 21C:
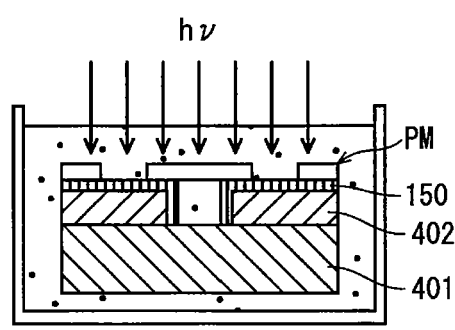

A pattern mask PM corresponding to an area where the solder resist layer 403 is to be formed is applied to the intermediate product. The intermediate product is then immersed in the batch of resin dispersion fluid, and exposed to ultraviolet radiation while keeping the intermediate product in a stable condition in the fluid (FIG. 21C). The pattern mask PM can be, for example, a photoresist layer formed by heretofore known exposure processing.

Specifically, the photopolymerizing compound dispersed in the fluid polymerizes around the second functional groups C5, which are photopolymerization initiating agents, in the vicinity of the organic coating 150 in the apertures of the pattern mask PM (or in pattern gaps if a photoresist layer is used). Given that progression of the polymerization reaction originates at positions near the second functional groups C5, a solder resist layer 403 with a single-molecule thickness can be formed by making the ultraviolet radiation exposure time very short. Also, making the ultraviolet radiation exposure time longer theoretically causes the formation of a solder resist layer with a thickness corresponding to the depth of the second functional groups C5.

Figure 21D:
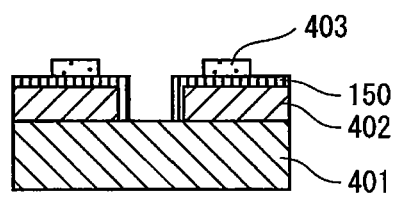

After the ultraviolet radiation hardening reaction, the intermediate product is removed from the batch, the mask is removed, and appropriate cleaning is performed thereon (FIG. 21D).

Figure 21E:
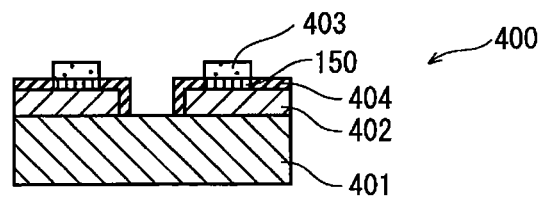
Figure 22A:
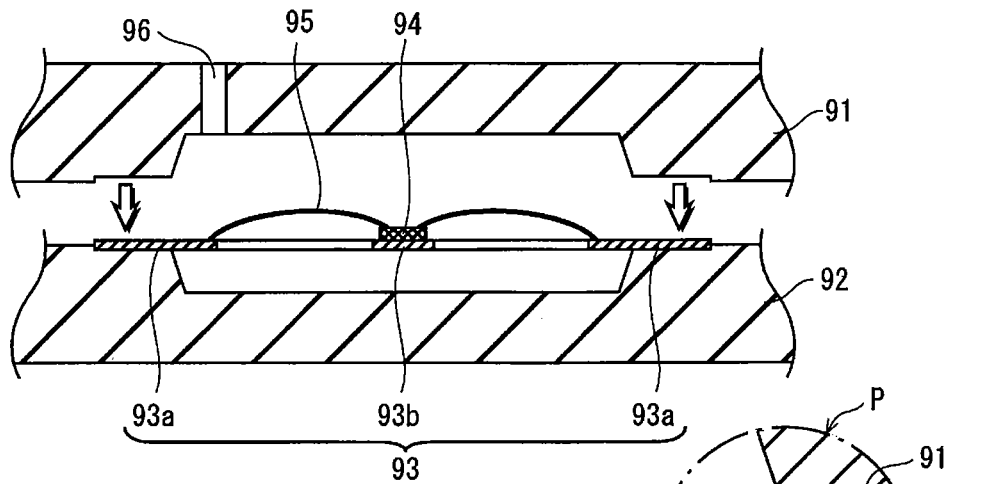
FIGS. 22A through 22D show processing during conventional injection molding of a semiconductor device.
Figure 22B:
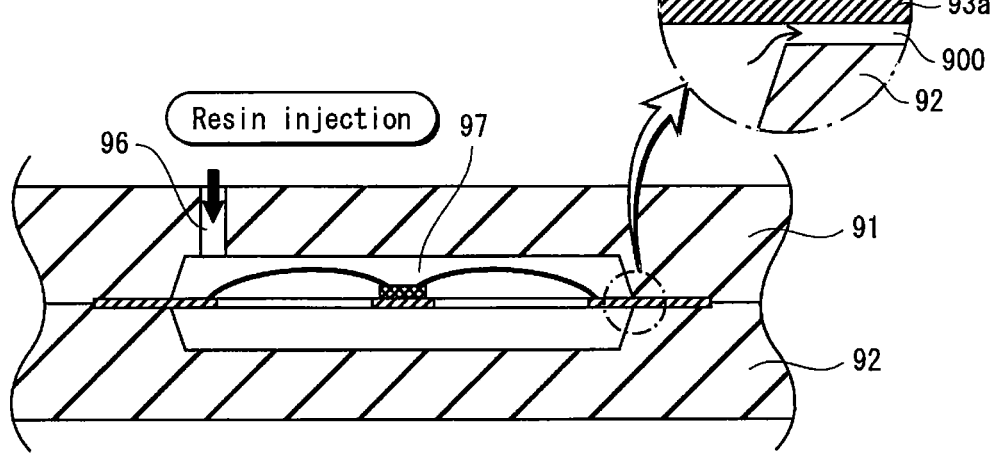
Figure 22C:
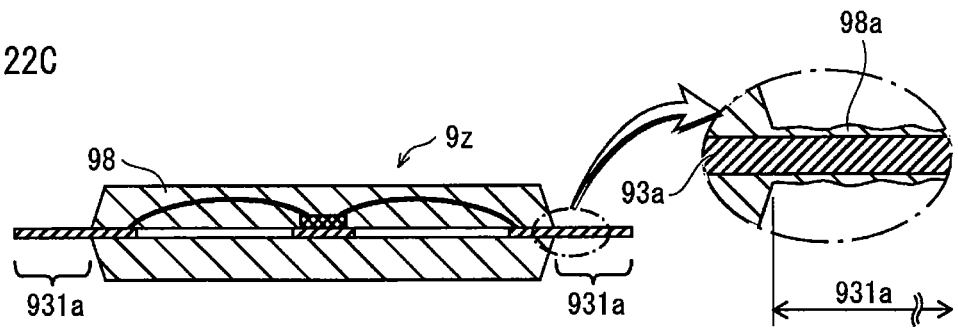
Figure 22D:
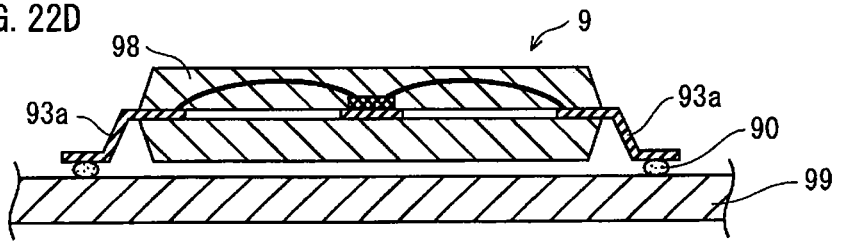

Thereafter, the organic coating 150 is removed from areas other than below the solder resist layer 403, and the Sn plating layer 404 is formed (FIG. 21E). This completes the manufacture of the film carrier tape 400.

As description is made in the above, the manufacturing method of embodiment 10 enables the adjustment of the solder resist layer 403 to an arbitrary thickness.

Also, according to this manufacturing method, the application of buoyancy to the solder resist material caused by the difference in specific gravity from the dispersion fluid does not occur, since the solder resist layer 403 formed on the organic coating 150 hardens quickly. Thus, the formation of the solder resist layer 403 on the organic coating 150 is performed without a loss of shape due to gravity. This has the benefit of enabling forming of a solder resist layer 403 with precision of shape and thickness.

Note that the thickness of the solder resist layer 403 can be controlled not only according to the ultraviolet radiation exposure time, but also by adjusting the concentration of compounds in the dispersion fluid.

Note that it is preferable to adjust the specific gravity of the dispersion fluid such that the photopolymerizing compound favorably disperses therein for a predetermined time period.

Furthermore, when polymerization reaction of the photopolymerizing compound is taking place in the vicinity of the second functional group, there are cases where the reaction rate is limited due to localized shortages of the photopolymerizing compound. If the specific gravity of the dispersion fluid is adjusted such that the photopolymerizing compound gradually settles, it is possible to prevent such unnecessary limitations on the reaction rate.

<Miscellaneous>

Although the organic coating is constituted from a single-molecule film by self-assembling functional organic molecules in the above-described embodiments, the organic coating may be multilayered as long as there is no degradation in the degree of adhesion to the substrate etc. of the semiconductor device.

When forming multilayered organic coating, a bonding property is required for the second functional groups and first functional groups of adjacent molecules between a first layer and a second layer composed of the functional organic molecules. In other words, it is necessary for the first functional group to be a compound or structure that has a bonding property for the second functional group as well as a metal bonding property for the wiring lead, die-pad, etc.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

INDUSTRIAL APPLICABILITY

The present invention can be expected to be useful in semiconductor devices consisting of IC, LSI, or VLSI packaged using sealing resin, as well as in LED devices having LED elements implemented thereon, and in film carrier tape or the like used in flexible substrates and the like.

REFERENCE SIGNS LIST 3 wiring lead
3a, 3b die-pads
10 semiconductor device
11 wiring lead
12 semiconductor element
13 wire
14, 121 resin body
21 metal coating
22 organic coating composed of purine skeleton compounds
31, 32 dies
35 wiring lead
36 LED device
42 LED chip 63 Ag plating coat
110, 120, 120a, 130, 140 organic coating
111-115, 112a functional organic molecules
122 reflector
400 film carrier tape
401 insulation film
402 wiring pattern layer
403 solder resist layer
404 Sn plating layer
A1-A5 first functional group
B1-B5 purine skeleton
C1-C5, C2' second functional group

The invention claimed is:

1. A package component comprising:
a wiring lead including a metal plate and an organic coating disposed to cover a surface of the metal plate; and
a resin covering a predetermined area on the surface of the metal plate,
wherein
the organic coating covers at least an area on the surface of the metal plate excluding the predetermined area on the surface thereof which is covered with the resin,
the organic coating is formed through self-assembly of a plurality of functional organic molecules, and
each of the functional organic molecules has a chemical structure having a purine skeleton, a first functional group, and a second functional group, the first functional group being provided at one end of the purine skeleton and the second functional group being provided at another end thereof, the first functional group being in a form for bonding with the wiring lead by at least one of a hydrogen bond and a coordinate bond, and the second functional group having either one of a resin hardening property and a resin-hardening promoting property.

2. The resin-sealed semiconductor device of claim 1, wherein
each of the functional organic molecules is a compound or a derivative of the compound, the compound composed of at least one compound expressed by formulas CHEM. 9 and CHEM. 10, and
the first functional group has at least one selected from the group consisting of a thiol compound, a sulfide compound, and a nitrogen-containing heterocyclic compound,

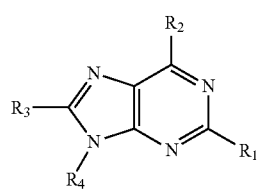

[CHEM 9]

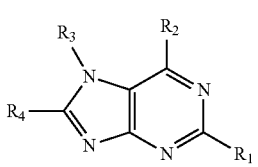

[CHEM 10]

wherein one of ends R1, R2, R3, and R4 is provided with the first functional group and another one of the ends R1, R2, R3, and R4 is provided with the second functional group, while the other ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol.

3. The resin-sealed semiconductor device of claim 2, wherein
the wiring lead having resin disposed to cover a surface thereof, wherein the surface of the wiring lead covered by the organic coating is greater in area than a surface of the wiring member which is covered with the resin.

4. The resin-sealed semiconductor device of claim 3, wherein
the resin is a thermosetting resin.

5. A semiconductor device including a wiring lead and a semiconductor element comprising:
an organic coating disposed to cover a surface of the wiring lead, wherein
the semiconductor element and an area on the surface of the wiring lead are covered with a resin,
the organic coating is formed through self-assembly of a plurality of functional organic molecules, and
each of the functional organic molecules has a chemical structure having a purine skeleton, a first functional group, and a second functional group, the first functional group being provided at one end of the purine skeleton and the second functional group being provided at another end thereof, the first functional group being in a form for bonding with the wiring lead by at least one of a hydrogen bond and a coordinate bond, and the second functional group either one of a resin hardening property and a resin-hardening promoting property.

6. The resin-sealed semiconductor device of claim 5, wherein
each of the functional organic molecules is a compound or a derivative of the compound, the compound composed of at least one compound expressed by formulas CHEM. 9 and CHEM. 10, and
the first functional group has at least one selected from the group consisting of a thiol compound, a sulfide compound, and a nitrogen-containing heterocyclic compound,

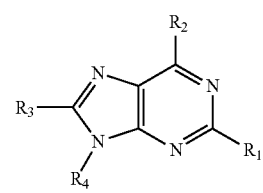

[CHEM 9]

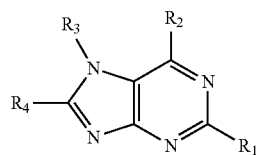

[CHEM 10]

wherein one of ends R1, R2, R3, and R4 is provided with the first functional group and another one of the ends R1, R2, R3, and R4 is provided with the second functional group, while the other ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol.

7. The resin-sealed semiconductor device of claim 6, wherein
the wiring lead having resin disposed to cover a surface thereof, wherein the surface of the wiring lead covered by the organic coating is greater in area than a surface of the wiring member which is covered with the resin.

8. The resin-sealed semiconductor device of claim 7, wherein
the resin is a thermosetting resin.

9. A resin-sealed semiconductor device comprising:
a wiring lead composed of a metallic material;
an organic coating disposed to cover a surface of the wiring lead, the organic coating being formed through self-assembly of a plurality of functional organic molecules,
wherein each of the functional organic molecules has a chemical structure having a purine skeleton, a first functional group, and a second functional group, the first functional group being provided at one end of the purine skeleton and the second functional group being provided at another end thereof, the first functional group being in a form for bonding with the wiring lead by at least one of a hydrogen bond and a coordinate bond, and the second functional group having either one of a resin hardening property and a resin-hardening promoting property, and the first functional groups bond with the wiring lead;
a semiconductor element mounted on and electrically connected to the wiring lead, wherein
a resin-sealing of the semiconductor device has been performed such that the semiconductor element is resin-sealed within the surface of a wiring member covered by the organic coating and a portion of the wiring lead remains externally exposed.

10. The resin-sealed semiconductor device of claim 9, wherein
each of the functional organic molecules is a compound or a derivative of the compound, the compound composed of at least one compound expressed by formulas CHEM. 9 and CHEM. 10, and
the first functional group has at least one selected from the group consisting of a thiol compound, a sulfide compound, and a nitrogen-containing heterocyclic compound,

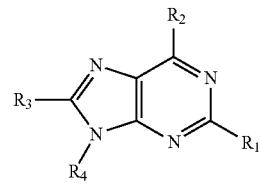

[CHEM 9]

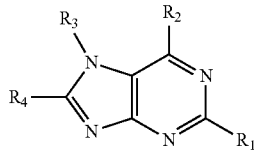

[CHEM 10]

wherein one of ends R1, R2, R3, and R4 is provided with the first functional group and another one of the ends R1, R2, R3, and R4 is provided with the second functional group, while the other ends are provided with one selected from the group consisting of a hydrogen atom, an amine, a hydroxyl, a ketone, an aldehyde, a carboxylic acid, a sulfonic acid, an amide, a hydrazide, a hydrazine, an amidine, an ether, a halogen, a nitrile, a methylene, an aryl, a siloxane, and a glycol.

11. The resin-sealed semiconductor device of claim 10, wherein
the wiring lead having resin disposed to cover a surface thereof, wherein the surface of the wiring lead covered by the organic coating is greater in area than a surface of the wiring member which is covered with the resin.

12. The resin-sealed semiconductor device of claim 11, wherein
the resin is a thermosetting resin.

* * * * *